US012772773B2

(12) United States Patent
Izuta

(10) Patent No.: US 12,772,773 B2
(45) Date of Patent: Oct. 20, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventor: Takashi Izuta, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 18 days.

(21) Appl. No.: 18/802,919

(22) Filed: Aug. 13, 2024

(65) Prior Publication Data

US 2025/0062115 A1 Feb. 20, 2025

(30) Foreign Application Priority Data

Aug. 18, 2023 (JP) ................................ 2023-133486

(51) Int. Cl.
*H10P 70/00* (2026.01)
*H10P 72/00* (2026.01)

(52) U.S. Cl.
CPC .............. *H10P 70/20* (2026.01); *H10P 70/15* (2026.01); *H10P 72/0414* (2026.01); *H10P 72/0422* (2026.01); *H10P 72/0424* (2026.01)

(58) Field of Classification Search
None
See application file for complete search history.

(56) References Cited

U.S. PATENT DOCUMENTS 9,184,060 B1 * 11/2015 Lee ........................ H10P 50/73
2006/0219258 A1 * 10/2006 Gast .................... H10P 72/0414 257/E21.228
2013/0034966 A1 * 2/2013 Yeh ....................... H10P 50/667 438/704
2014/0137902 A1 * 5/2014 Aiura ................. H10P 72/0414 134/104.2
2014/0261172 A1 * 9/2014 Ito ....................... H10P 72/0414 118/712
(Continued)

FOREIGN PATENT DOCUMENTS

CN 114695176 A 7/2022
JP 2002059067 A * 2/2002
(Continued)

*Primary Examiner* — Kaj K Olsen
*Assistant Examiner* — Richard Z. Zhang
(74) *Attorney, Agent, or Firm* — OSTROLENK FABER LLP

(57) ABSTRACT

A substrate processing method includes a first chemical liquid step of supplying a first chemical liquid to the substrate, a rinsing step of supplying a rinse liquid to the substrate, a removal step of rotating the substrate in a state in which the supply of the rinse liquid is stopped, and discharging the rinse liquid from a recess portion, and removing the rinse liquid from the substrate, and a second chemical liquid step of supplying a second chemical liquid to the substrate from which the rinse liquid has been removed. In the first chemical liquid step, the first chemical liquid discharged from the rotating substrate is received by a first guard. In the rinsing step, the first guard is switched to a second guard. In the removal step and in the second chemical liquid step, the first rinse liquid and the second chemical liquid discharged from the rotating substrate are received by the second guard.

18 Claims, 15 Drawing Sheets

(56) References Cited

U.S. PATENT DOCUMENTS

| | | | | |
|---|---|---|---|---|
| 2015/0064910 | A1 | 3/2015 | Kaneko et al. | |
| 2015/0114561 | A1 | 4/2015 | Higashijima et al. | |
| 2015/0340251 | A1 | 11/2015 | Wakita et al. | |
| 2016/0074913 | A1* | 3/2016 | Hanawa | B08B 3/12 134/1 |
| 2017/0282210 | A1* | 10/2017 | Okutani | B05D 1/002 |
| 2019/0091640 | A1* | 3/2019 | Nishide | B01F 35/82 |
| 2019/0295839 | A1* | 9/2019 | Endo | H10P 70/20 |
| 2020/0043756 | A1 | 2/2020 | Rangarajan et al. | |
| 2020/0248076 | A1* | 8/2020 | Seike | C09K 13/00 |
| 2021/0299712 | A1* | 9/2021 | Akiyama | B08B 7/0014 |
| 2022/0013633 | A1* | 1/2022 | Matsushima | H10D 30/668 |
| 2022/0205093 | A1 | 6/2022 | Kim et al. | |
| 2022/0301880 | A1 | 9/2022 | Yamashita et al. | |
| 2023/0187199 | A1 | 6/2023 | Okamura | |
| 2024/0001411 | A1 | 1/2024 | Endo et al. | |
| 2024/0426024 | A1* | 12/2024 | Noda | C30B 29/40 |

FOREIGN PATENT DOCUMENTS

| | | | |
|---|---|---|---|
| JP | 2009-110984 | A | 5/2009 |
| JP | 2009-218456 | A | 9/2009 |
| JP | 2009-224692 | A | 10/2009 |
| JP | 2020-035777 | A | 3/2020 |
| JP | 2021-141087 | A | 9/2021 |
| JP | 2022-086094 | A | 6/2022 |
| KR | 10-2022-0130016 | A | 9/2022 |
| KR | 10-2022-0153666 | A | 11/2022 |
| TW | 201523765 | A | 6/2015 |
| TW | 202010013 | A | 3/2020 |
| TW | 202017080 | A | 5/2020 |
| WO | WO2020044862 | A1 * | 3/2020 |

* cited by examiner

SUBSTRATE PROCESSING METHOD AND SUBSTRATE PROCESSING APPARATUS

CROSS REFERENCE TO RELATED APPLICATIONS

This application claims priority under 35 U.S.C. § 119, based on Japanese Patent Application No. 2023-133486 filed on Aug. 18, 2023, the entire disclosure of which is incorporated herein by reference.

TECHNICAL FIELD

A subject of this application relates to a substrate processing method and a substrate processing apparatus.

BACKGROUND ART

Japanese Patent Application Publication No. 2020-35777 discloses a substrate processing method and a substrate processing apparatus for processing a substrate that has a pattern including a recess portion. In detail, Japanese Patent Application Publication No. 2020-35777 discloses a substrate processing method that is performed by use of a single substrate processing apparatus, and discloses this single substrate processing apparatus. Japanese Patent Application Publication No. 2020-35777 discloses a process in which a cleaning process is performed, and then a removal step of removing a processing liquid, which has entered the recess portion, from the substrate is performed. Also, Japanese Patent Application Publication No. 2020-35777 discloses a process in which the removal step is performed, and then an etching step is performed.

In detail, Japanese Patent Application Publication No. 2020-35777 discloses a process in which the processing liquid is removed from the substrate by exposing the substrate to IPA steam (isopropyl alcohol steam) and then by drying the substrate in the single substrate processing apparatus. Also, Japanese Patent Application Publication No. 2020-35777 discloses a process in which an atmosphere around the substrate is set to a nitrogen gas atmosphere during the removal step. With a technique disclosed by Japanese Patent Application Publication No. 2020-35777, it is possible to avoid the formation of a natural oxide film on a surface of the substrate by means of the nitrogen gas atmosphere that is an atmosphere around the substrate.

SUMMARY

However, according to the substrate processing method and the substrate processing apparatus of Japanese Patent Application Publication No. 2020-35777, a configuration formed to supply IPA steam and a configuration formed to supply nitrogen gas are required to remove a processing liquid, which has entered the recess portion, from the substrate. Therefore, the configuration becomes complicated. Therefore, the technique for removing the processing liquid, which has entered the recess portion, from the substrate has room for further improvement.

According to an aspect of the present disclosure, a substrate processing method is a method of processing a substrate having a pattern including a recess portion. This method includes a first chemical liquid step of supplying a first chemical liquid to the substrate, a rinsing step of supplying a first rinse liquid to the substrate, a removal step of rotating the substrate in a state in which supply of the first rinse liquid is stopped, and discharging the first rinse liquid from the recess portion, and removing the first rinse liquid from the substrate, and a second chemical liquid step of supplying a second chemical liquid to the substrate from which the first rinse liquid has been removed. In the first chemical liquid step, the first chemical liquid is supplied to the substrate that is rotating, and the first chemical liquid discharged from the substrate is received by a first guard surrounding the substrate. In the rinsing step, a guard surrounding the substrate is switched from the first guard to a second guard. In the removal step, the first rinse liquid discharged from the substrate that is rotating is received by the second guard. In the second chemical liquid step, the second chemical liquid is supplied to the substrate that is rotating, and the second chemical liquid discharged from the substrate that is rotating is received by the second guard.

In a preferred embodiment, the rinsing step includes a step of supplying the first rinse liquid to the substrate that is rotating and a paddling step of holding a liquid film of the first rinse liquid on the substrate. In the paddling step, the guard surrounding the substrate is switched from the first guard to the second guard.

In a preferred embodiment, in the removal step and in the second chemical liquid step, the first rinse liquid and the second chemical liquid received by the second guard are recovered.

In a preferred embodiment, in the removal step, the substrate is rotated at a rotation speed equal to a rotation speed of the substrate when the second chemical liquid step is started.

In a preferred embodiment, the rinsing step is a first rinsing step. The substrate processing method further includes a second rinsing step of supplying a second rinse liquid to the substrate that is rotating and of washing away the second chemical liquid from the substrate, and a drying step of increasing the rotation speed of the substrate and drying the substrate. In the removal step, the substrate is rotated at a lower rotation speed than a rotation speed at which the substrate is rotated in the drying step.

In a preferred embodiment, the rinsing step is a first rinsing step. The substrate processing method further includes a second rinsing step of supplying a second rinse liquid to the substrate that is rotating and of washing away the second chemical liquid from the substrate and a drying step of increasing the rotation speed of the substrate and drying the substrate. A length of time (period of time) of the removal step is shorter than a length of time (period of time) of the drying step.

In a preferred embodiment, the pattern includes a multi-layer laminated structure in which a polysilicon layer and a silicon oxide layer are alternately laminated.

In a preferred embodiment, the multi-layer laminated structure includes a laminated structure having eighty or more layers.

In a preferred embodiment, the recess portion is hollowed in a lamination direction that is a direction in which the polysilicon layer and the silicon oxide layer are alternately laminated. The second chemical liquid step includes a step of etching the polysilicon layer and forming a dent on an inner surface of the recess portion.

In a preferred embodiment, the first chemical liquid includes an acidic chemical liquid. The second chemical liquid includes an alkaline chemical liquid.

According to another aspect of the present disclosure, a substrate processing apparatus processes a substrate having a pattern including a recess portion. This substrate processing apparatus includes a substrate holding portion (substrate holder), a substrate rotating portion (substrate rotator), a processing liquid supply portion (processing liquid supply), a plurality of guards, an elevating/lowering portion (lift), and a control portion (controller). The substrate holding portion horizontally holds the substrate. The substrate rotating portion rotates the substrate holding portion about a central axis extending in an up-down direction and that rotates the substrate together with the substrate holding portion. The processing liquid supply portion supplies a processing liquid to the substrate. The plurality of guards surround the substrate and that receive the processing liquid discharged from the substrate. The elevating/lowering portion individually elevates and lowers the plurality of guards and that switches a guard surrounding the substrate among the plurality of guards. The control portion controls the substrate rotating portion, the processing liquid supply portion, and the elevating/lowering portion. The processing liquid includes a first chemical liquid, a first rinse liquid, and a second chemical liquid. The plurality of guards include a first guard and a second guard. The control portion is configured or programmed to perform first chemical liquid processing in which the first chemical liquid is supplied to the substrate while controlling the processing liquid supply portion, rinse processing in which the first rinse liquid is supplied to the substrate while controlling the processing liquid supply portion, removal processing in which the substrate is rotated while controlling the substrate rotating portion in a state in which supply of the first rinse liquid is stopped by controlling the processing liquid supply portion and in which the first rinse liquid is discharged from the recess portion, and the first rinse liquid is removed from the substrate, second chemical liquid processing in which the second chemical liquid is supplied to the substrate from which the first rinse liquid has been removed while controlling the processing liquid supply portion, processing in which the substrate is rotated during the first chemical liquid processing, during the rinse processing, and during the second chemical liquid processing while controlling the substrate rotating portion, processing in which the first chemical liquid discharged from the substrate that is rotating is received by the first guard during the first chemical liquid processing while controlling the elevating/lowering portion, and processing in which the guard surrounding the substrate is switched from the first guard to the second guard, and the first rinse liquid and the second chemical liquid discharged from the substrate that is rotating are received by the second guard during the removal processing and during the second chemical liquid processing while controlling the elevating/lowering portion during the rinse processing.

In a preferred embodiment, the rinse processing includes processing in which the substrate is rotated while controlling the substrate rotating portion and the first rinse liquid is supplied to the substrate that is rotating while controlling the processing liquid supply portion and paddle processing in which a liquid film of the first rinse liquid is held on the substrate. The control portion is configured or programmed to control the elevating/lowering portion during the paddle processing, and to cause the elevating/lowering portion to switch the guard surrounding the substrate from the first guard to the second guard.

In a preferred embodiment, the substrate processing apparatus further includes a recovery portion. The recovery portion recovers the first rinse liquid and the second chemical liquid that have been received by the second guard.

In a preferred embodiment, the control portion is configured or programmed to control the substrate rotating portion, and to cause the substrate rotating portion to rotate the substrate during the removal processing at a rotation speed equal to a rotation speed of the substrate shown when the second chemical liquid processing is started.

In a preferred embodiment, the rinse processing is first rinse processing. The control portion is configured or programmed to further perform second rinse processing in which the second rinse liquid is supplied to the substrate by controlling the processing liquid supply portion while rotating the substrate by controlling the substrate rotating portion and the second chemical liquid is washed away from the substrate and drying processing in which a rotation speed of the substrate is increased while controlling the substrate rotating portion and the substrate is dried. The control portion is configured or programmed to control the substrate rotating portion, and to cause the substrate rotating portion to rotate the substrate at a lower rotation speed during the removal processing than a rotation speed of the substrate during the drying processing.

In a preferred embodiment, the rinse processing is first rinse processing. The control portion is configured or programmed to further perform second rinse processing in which the second rinse liquid is supplied to the substrate by controlling the processing liquid supply portion while rotating the substrate by controlling the substrate rotating portion and the second chemical liquid is washed away from the substrate and drying processing in which a rotation speed of the substrate is increased while controlling the substrate rotating portion and the substrate is dried. The control portion is configured or programmed to perform the removal processing in a shorter period of time than the drying processing.

In a preferred embodiment, the pattern includes a multi-layer laminated structure in which a polysilicon layer and a silicon oxide layer are alternately laminated.

In a preferred embodiment, the multi-layer laminated structure includes a laminated structure having eighty or more layers.

In a preferred embodiment, the recess portion is hollowed in a lamination direction that is a direction in which the polysilicon layer and the silicon oxide layer are alternately laminated. The control portion is configured or programmed to etch the polysilicon layer by the second chemical liquid processing, and to form a dent on an inner surface of the recess portion.

In a preferred embodiment, the first chemical liquid includes an acidic chemical liquid. The second chemical liquid includes an alkaline chemical liquid.

DETAILED DESCRIPTION OF PREFERRED EMBODIMENTS

Preferred embodiments according to a substrate processing method and a substrate processing apparatus each of which is a subject of the present application will be hereinafter described with reference to the drawings (FIG. 1 to FIG. 15). It should be noted that the subject of the present application are not limited to the preferred embodiments mentioned below, and can be carried out in various modes in a range not departing from its gist. With respect to a point a description of which is repeated, this description is appropriately omitted if necessary. Also, the same reference sign is assigned to the same or equivalent portion, and a description of such a portion is not repeated.

Various substrates, such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk, are applicable to the "substrate" that is a target to be subjected to substrate processing in the substrate processing method and the substrate processing apparatus each of which is a subject of the present application. A preferred embodiment of the present disclosure will be hereinafter described while chiefly taking a case in which a disk-shaped semiconductor wafer is a target to be subjected to substrate processing as an example, and yet the substrate processing method and the substrate processing apparatus each of which is a subject of the present application are likewise applicable to various substrates other than this semiconductor wafer. Also, with respect to the shape of the substrate, the substrate processing method and the substrate processing apparatus each of which is a subject of the present application are applicable to substrates having various shapes without being limited to the disk shape.

Figure 1:
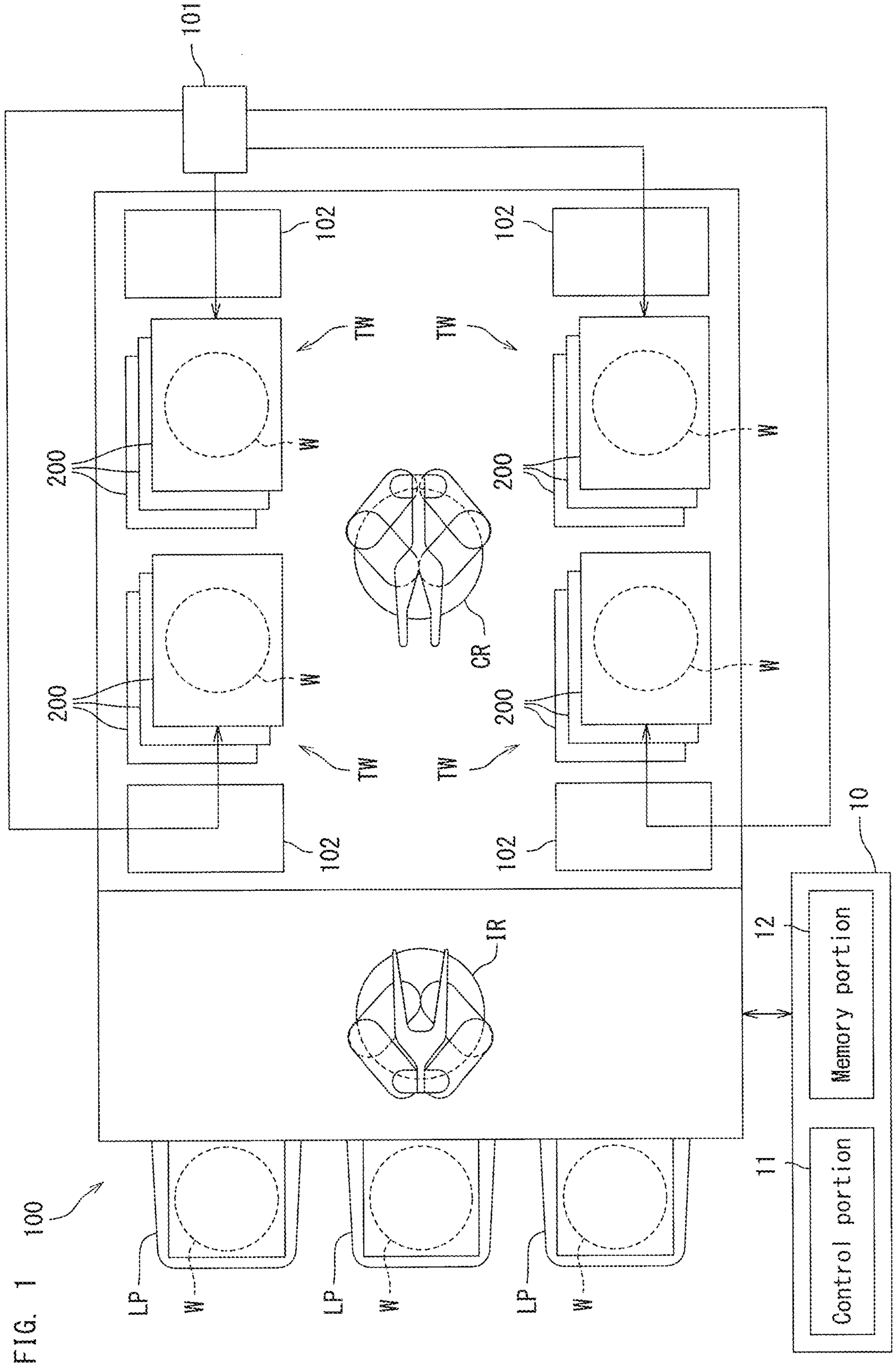
FIG. 1 is a schematic view of a substrate processing apparatus according to a preferred embodiment.

FIG. 1 is a schematic view of a substrate processing apparatus 100 of the present preferred embodiment. In detail, FIG. 1 is a schematic plan view of the substrate processing apparatus 100. The substrate processing apparatus 100 processes a substrate W by use of a plurality of kinds of processing liquids. In more detail, the substrate processing apparatus 100 is a single substrate processing type apparatus, and processes substrates W one by one.

The substrate processing apparatus 100 includes a plurality of substrate processing portions 200 (processing units), a fluid cabinet 101, a plurality of fluid boxes 102, a plurality of load ports LP, an indexer robot IR, a center robot CR, and a controller 10 as shown in FIG. 1.

Each of the load ports LP houses a plurality of substrates W stacked together. Each of the substrates W has a pattern PT including a plurality of recess portions 320 (see FIG. 4A and FIG. 4B). For example, the substrate W (semiconductor wafer) includes a substrate that is used to produce a semiconductor product having a 3D structure, such as a three-dimensional flash memory (e.g., three-dimensional NAND flash memory).

The indexer robot IR transfers a substrate W between the load port LP and the center robot CR. The center robot CR transfers a substrate W between the indexer robot IR and the substrate processing portion 200. A device configuration may be employed in which a stand (pass) on which a substrate W is temporarily placed is provided between the indexer robot IR and the center robot CR, and the substrate W is indirectly handed over between the indexer robot IR and the center robot CR by use of the stand.

The substrate processing portions 200 form a plurality of towers TW (in FIG. 1, four towers TW). The towers TW are arranged so as to surround the center robot CR in a plan view. Each of the towers TW includes a plurality of substrate processing portions 200 stacked together upwardly and downwardly (in FIG. 1, three substrate processing portions 200).

The fluid cabinet 101 contains a processing liquid. Each of the fluid boxes 102 corresponds to one of the plurality of towers TW. The processing liquid in the fluid cabinet 101 is supplied to all of the substrate processing portions 200 included in the corresponding tower TW through any one of the fluid boxes 102.

Each of the substrate processing portions 200 processes a substrate W by use of a plurality of kinds of processing liquids. In other words, each of the substrate processing portions 200 applies substrate processing to the substrate W. In detail, each of the substrate processing portions 200 successively supplies the plurality of kinds of processing liquids to the substrate W and processes the substrate W. The plurality of kinds of processing liquids include a first chemical liquid, a second chemical liquid, and a rinse liquid. In this preferred embodiment, the first chemical liquid is an acidic chemical liquid. The second chemical liquid is an alkaline chemical liquid. The first chemical liquid includes, for example, DHF (diluted hydrofluoric acid) or BHF (buffered hydrofluoric acid). The second chemical liquid includes, for example, tetramethylammonium hydroxide (TMAH). In this preferred embodiment, the first chemical liquid is DHF. The second chemical liquid is TMAH.

In this preferred embodiment, each of the substrate processing portions 200 applies an etching process to the substrate W. In detail, each of the substrate processing portions 200 removes a natural oxide film 340 from a surface of the substrate W by use of the first chemical liquid (DHF), and then etches the substrate W by use of the second chemical liquid (TMAH). In more detail, the substrate W includes a polysilicon layer 332 (see FIG. 4B). Each of the substrate processing portions 200 etches the polysilicon layer 332 by use of the second chemical liquid (TMAH).

In this preferred embodiment, the rinse liquid is deionized water (DIW). For example, the rinse liquid may be so-called "ultrapure water." However, the rinse liquid is not limited to deionized water. For example, the rinse liquid can be carbonic water, electrolyzed ion water, hydrogen water, ozone water, ammonia water, or diluted hydrochloric acid water (e.g., hydrochloric acid water whose concentration is about 10 ppm to 100 ppm).

The controller 10 controls the operation of each portion of the substrate processing apparatus 100. For example, the controller 10 controls the substrate processing portion 200, the load port LP, the indexer robot IR, and the center robot CR. The controller 10 includes a control portion 11 and a memory portion 12.

The control portion 11 controls the operation of each portion of the substrate processing apparatus 100 on the basis of various pieces of information stored in the memory portion 12. The control portion 11 has, for example, a processor. The control portion 11 may have a CPU (Central Processing Unit) or an MPU (Micro Processing Unit) as the processor. Alternatively, the control portion 11 may have a general purpose arithmetic unit or a special purpose arithmetic unit.

The memory portion 12 stores various pieces of information to control the operation of the substrate processing apparatus 100. For example, the memory portion 12 stores various data and various computer programs. The various data include recipe data. The recipe data show a recipe that prescribes processing contents, processing conditions, and processing procedures of the substrate W. Various set values during the execution of substrate processing are set as the processing conditions in the recipe.

The memory portion 12 has a main storage device. The main storage device includes, for example, a semiconductor memory. The memory portion 12 may additionally have an auxiliary storage device. For example, the auxiliary storage device includes at least either one of a semiconductor memory and a hard disk drive. The memory portion 12 may include a removable medium.

Figure 2:
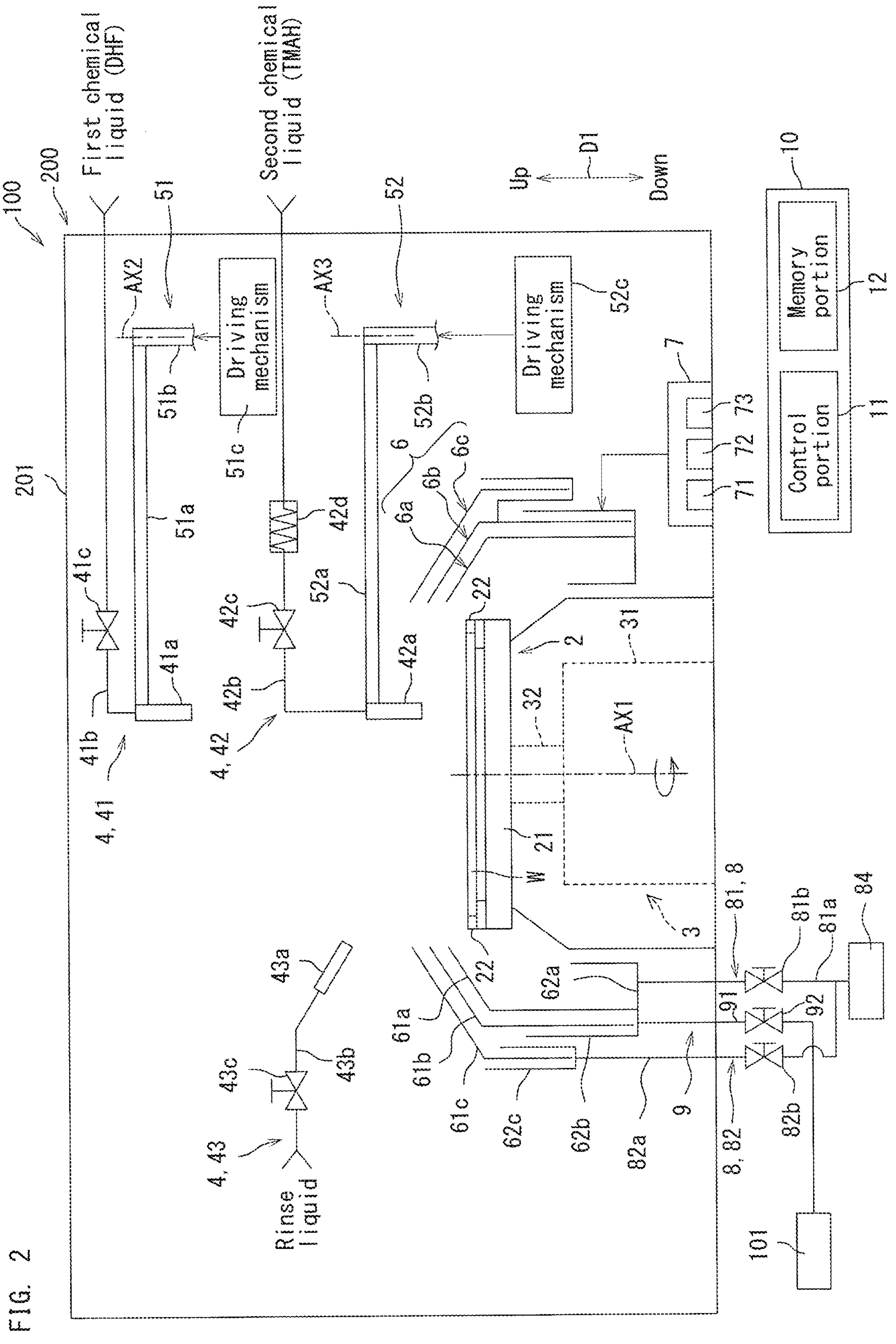
FIG. 2 is a cross-sectional view that schematically shows a configuration of a substrate processing portion included in the substrate processing apparatus according to the preferred embodiment.

Next, the substrate processing apparatus 100 of this preferred embodiment will be further described with reference to FIG. 1 and FIG. 2. FIG. 2 is a cross-sectional view that schematically shows a configuration of the substrate processing portion 200 included in the substrate processing apparatus 100 of this preferred embodiment.

The substrate processing portion 200 has a processing room 201, a substrate holding portion 2 (substrate holder), a substrate rotating portion 3 (substrate rotator), a processing liquid supply portion 4 (processing liquid supply), a first nozzle moving portion 51, a second nozzle moving portion 52, a plurality of guard portions 6, and an elevating/lowering portion 7 (lift) as shown in FIG. 2. Also, the substrate processing apparatus 100 additionally includes a drainage portion 8 and a recovery portion 9.

The substrate W is carried into the processing room 201, and is processed in the processing room 201. The processing room 201 has a substantially box-shaped form. The processing room 201 houses the substrate holding portion 2, the substrate rotating portion 3, a part of the processing liquid supply portion 4, the first nozzle moving portion 51, the second nozzle moving portion 52, the plurality of guard portions 6, the elevating/lowering portion 7, a part of the drainage portion 8, and a part of the recovery portion 9. The processing room 201 is, for example, a chamber.

The substrate holding portion 2 horizontally holds the substrate W. The substrate holding portion 2 is controlled by the controller 10 (control portion 11). The substrate holding portion 2 is, for example, a spin chuck. The substrate holding portion 2 may have a spin base 21 and a plurality of chuck members 22 as shown in FIG. 2.

The spin base 21 has a substantially disk-shaped form, and supports the chuck members 22 in a horizontal posture. The chuck members 22 are arranged at a peripheral edge portion of the spin base 21. The chuck members 22 clamp the peripheral edge portion of the substrate W. The substrate W is held in a horizontal posture by means of the chuck members 22. The operation of the chuck members 22 is controlled by the controller 10 (control portion 11). The chuck members 22 are arranged so that the center of the substrate W faces the center of the spin base 21 in an up-down direction D1.

The substrate rotating portion 3 rotates the substrate holding portion 2 about a first rotational axis AX1 extending in the up-down direction D1, and rotates the substrate W together with the substrate holding portion 2. In more detail, the first rotational axis AX1 passes through the center of the spin base 21. Therefore, the spin base 21 rotates while setting the center of the spin base 21 as a rotational center. Also, the center of the substrate W faces the center of the spin base 21 in the up-down direction D1 as described above. Therefore, the substrate W rotates while setting the center of the substrate W as a rotational center. The first rotational axis AX1 is an example of a "central axis." The substrate rotating portion 3 is controlled by the controller 10 (control portion 11).

The substrate rotating portion 3 may have, for example, a motor body 31 and a shaft 32 as shown in FIG. 2. The shaft 32 is joined to the spin base 21. The motor body 31 rotates the shaft 32. As a result, the spin base 21 rotates. The operation of the motor body 31 is controlled by the controller 10 (control portion 11).

The processing liquid supply portion 4 supplies a plurality of kinds of processing liquids to the substrate W. The processing liquid supply portion 4 is controlled by the controller 10 (control portion 11). In detail, the processing liquid supply portion 4 includes a first chemical liquid supply portion 41, a second chemical liquid supply portion 42, and a rinse liquid supply portion 43.

The first chemical liquid supply portion 41 is controlled by the controller 10 (control portion 11), and supplies a first chemical liquid to the substrate W held by the substrate holding portion 2. In detail, the first chemical liquid supply portion 41 supplies a first chemical liquid to the substrate W that is rotating. In this preferred embodiment, the first chemical liquid supply portion 41 supplies DHF to the substrate W.

In detail, the first chemical liquid supply portion 41 has a first discharge nozzle 41*a*, a first chemical liquid supply piping 41*b*, and a first chemical liquid open/close valve 41*c* as shown in FIG. 2. The processing room 201 houses the first discharge nozzle 41*a* and a part of the first chemical liquid supply piping 41*b*. In this preferred embodiment, the first chemical liquid open/close valve 41*c* is arranged outside the processing room 201. In detail, the first chemical liquid open/close valve 41*c* is housed in the fluid box 102 described with reference to FIG. 1. Also, the first chemical liquid supply piping 41*b* is introduced into the inside of the processing room 201 from the outside of the processing room 201. In detail, the first chemical liquid supply piping 41*b* is introduced into the inside of the processing room 201 from the fluid box 102.

The first discharge nozzle 41*a* discharges the first chemical liquid (DHF) toward an upper surface of the substrate W from above the substrate W that is rotating. As a result, the first chemical liquid is supplied to the substrate W, and a liquid film LF1 of the first chemical liquid is formed on the upper surface of the substrate W.

The first chemical liquid supply piping 41*b* is, for example, a tube. One end of the first chemical liquid supply piping 41*b* is connected to the first discharge nozzle 41*a*. The first chemical liquid supply piping 41*b* supplies the first chemical liquid (DHF) to the first discharge nozzle 41*a*.

The first chemical liquid open/close valve 41*c* is interposed in the first chemical liquid supply piping 41*b*. The first chemical liquid open/close valve 41*c* controls the supply of the first chemical liquid (DHF) to the first discharge nozzle 41*a* and the supply stop of the first chemical liquid (DHF) to the first discharge nozzle 41*a*.

In detail, the first chemical liquid open/close valve 41*c* is switchable between an open state and a closed state. The controller 10 (control portion 11) controls the open/close operation of the first chemical liquid open/close valve 41*c*. An actuator of the first chemical liquid open/close valve 41*c* is, for example, a pneumatic actuator or an electric actuator. When the first chemical liquid open/close valve 41*c* is in an open state, the first chemical liquid (DHF) flows to the first discharge nozzle 41*a* through the first chemical liquid supply piping 41*b*. On the other hand, when the first chemical liquid open/close valve 41*c* is in a closed state, the flow of the first chemical liquid through the first chemical liquid supply piping 41*b* is stopped.

The first nozzle moving portion 51 moves the first discharge nozzle 41*a* along a horizontal surface. The operation of the first nozzle moving portion 51 is controlled by the controller 10 (control portion 11). In more detail, the first nozzle moving portion 51 moves the first discharge nozzle 41*a* between a first retreat position EP1 (see FIG. 3) and a processing position. The first retreat position EP1 is a position outside the substrate holding portion 2. For example, the first retreat position EP1 may be a position outside the plurality of guard portions 6. In this preferred embodiment, the processing position of the first discharge nozzle 41*a* is a position CP (see FIG. 3) that faces the center of the substrate W in the up-down direction D1. The position CP facing the center of the substrate W is hereinafter referred to at times as a "center position CP." The first discharge nozzle 41*a* supplies the first chemical liquid (DHF) from the center position CP (processing position) to the substrate W.

The first nozzle moving portion 51 may have a first nozzle arm 51*a*, a first nozzle base 51*b*, and a first nozzle moving mechanism 51*c* as shown in FIG. 2. The first nozzle base 51*b* extends in the up-down direction D1. A base end portion of the first nozzle arm 51*a* is joined to the first nozzle base 51*b*. The first nozzle arm 51*a* extends in a horizontal direction from the first nozzle base 51*b*.

The first nozzle arm 51*a* supports the first discharge nozzle 41*a*. The first discharge nozzle 41*a* protrudes downwardly from the first nozzle arm 51*a*. The first discharge nozzle 41*a* may be arranged at a forward end portion of the first nozzle arm 51*a*.

The first nozzle moving mechanism 51*c* rotates the first nozzle base 51*b* in both directions of forward and reverse directions about a second rotational axis AX2 extending in the up-down direction D1. As a result, the first discharge nozzle 41*a* moves around the first nozzle base 51*b* along a circumferential direction centering on the second rotational axis AX2.

The first nozzle moving mechanism 51*c* is controlled by the controller 10 (control portion 11). An actuator of the first nozzle moving mechanism 51*c* includes, for example, a ball screw mechanism and an electric motor that is rotatable in the forward and reverse directions. The electric motor gives a driving force to the ball screw mechanism. Alternatively, the actuator of the first nozzle moving mechanism 51*c* may include an electric motor that is rotatable in the forward and reverse directions and a speed reducer.

The second chemical liquid supply portion 42 supplies the second chemical liquid to the substrate W held by the substrate holding portion 2. In detail, the second chemical liquid supply portion 42 is controlled by the controller 10 (control portion 11), and supplies the second chemical liquid to the substrate W that is rotating. In this preferred embodiment, the second chemical liquid supply portion 42 supplies TMAH to the substrate W.

In detail, the second chemical liquid supply portion 42 has a second discharge nozzle 42*a*, a second chemical liquid supply piping 42*b*, a second chemical liquid open/close valve 42*c*, and a heater 42*d* as shown in FIG. 2. The processing room 201 houses the second discharge nozzle 42*a* and a part of the second chemical liquid supply piping 42*b*. In this preferred embodiment, the second chemical liquid open/close valve 42*c* and the heater 42*d* are arranged outside the processing room 201. In detail, the second chemical liquid open/close valve 42*c* and the heater 42*d* are housed in the fluid box 102 described with reference to FIG. 1. Also, the second chemical liquid supply piping 42*b* is introduced into the inside of the processing room 201 from the outside of the processing room 201. In detail, the second chemical liquid supply piping 42*b* is introduced into the inside of the processing room 201 from the fluid box 102.

The second discharge nozzle 42*a* discharges the second chemical liquid (TMAH) toward the upper surface of the substrate W from above the substrate W that is rotating. As a result, the second chemical liquid is supplied to the substrate W, and a liquid film LF3 of the second chemical liquid is formed on the upper surface of the substrate W. The second chemical liquid supply piping 42*b* supplies the second chemical liquid to the second discharge nozzle 42*a*. The second chemical liquid open/close valve 42*c* controls the supply of the second chemical liquid to the second discharge nozzle 42*a* and the supply stop of the second chemical liquid to the second discharge nozzle 42*a*. The second discharge nozzle 42*a*, the second chemical liquid supply piping 42*b*, and the second chemical liquid open/close valve 42*c* are substantially the same in configuration as the first discharge nozzle 41*a*, the first chemical liquid supply piping 41*b*, and the first chemical liquid open/close valve 41*c*, respectively, and therefore a detailed description of these components is omitted.

The heater 42*d* is interposed in the second chemical liquid supply piping 42*b*. The heater 42*d* heats the second chemical liquid (TMAH) flowing through the second chemical liquid supply piping 42*b*. The driving start and the driving stop of the heater 42*d* are controlled by the controller 10 (control portion 11). The controller 10 (control portion 11) may control a temperature or a preset temperature of the heater 42*d*. For example, the heater 42*d* heats the second chemical liquid flowing through the second chemical liquid supply piping 42*b* so that the temperature of the second chemical liquid becomes 40° C.

The second nozzle moving portion 52 moves the second discharge nozzle 42*a* along a horizontal surface. The operation of the second nozzle moving portion 52 is controlled by the controller 10 (control portion 11). In more detail, the second nozzle moving portion 52 moves the second discharge nozzle 42*a* between a second retreat position EP2 (see FIG. 3) and the center position CP. Furthermore, the second nozzle moving portion 52 moves the second discharge nozzle 42*a* between the center position CP and a first end portion facing position P1 (see FIG. 3). The first end portion facing position P1 shows a position at which the nozzle 42*a* faces an end portion E of the substrate W (see FIG. 3) in the up-down direction D1.

In this preferred embodiment, the second discharge nozzle 42*a* discharges the second chemical liquid (TMAH) from the center position CP toward the upper surface of the substrate W that is rotating. Furthermore, the second discharge nozzle 42*a* discharges the second chemical liquid toward the upper surface of the rotating substrate W while moving between the center position CP and the first end portion facing position P1. The second retreat position EP2 is a position located outside the substrate holding portion 2 in the same way as the first retreat position EP1. For example, the second retreat position EP2 may be a position outside the guard portions 6.

The second nozzle moving portion 52 may have a second nozzle arm 52*a*, a second nozzle base 52*b*, and a second nozzle moving mechanism 52*c* as shown in FIG. 2. The second nozzle arm 52*a* supports the second discharge nozzle 42*a*. A base end portion of the second nozzle arm 52*a* is joined to the second nozzle base 52*b*. The second nozzle moving mechanism 52*c* rotates the second nozzle base 52*b* in both directions of forward and reverse directions about a third rotational axis AX3 extending in the up-down direction D1. The second nozzle arm 52*a*, the second nozzle base 52*b*, and the second nozzle moving mechanism 52*c* are substantially the same in configuration as the first nozzle arm 51*a*, the first nozzle base 51*b*, and the first nozzle moving mechanism 51*c*, respectively, and therefore a detailed description of these components is omitted.

The rinse liquid supply portion 43 supplies a rinse liquid to the substrate W held by the substrate holding portion 2. In detail, the rinse liquid supply portion 43 is controlled by the controller 10 (control portion 11), and supplies a rinse liquid to the substrate W that is rotating.

In detail, the rinse liquid supply portion 43 has a third discharge nozzle 43*a*, a rinse liquid supply piping 43*b*, and a rinse liquid open/close valve 43*c* as shown in FIG. 2. The processing room 201 houses the third discharge nozzle 43*a* and a part of the rinse liquid supply piping 43*b*. In this preferred embodiment, the rinse liquid open/close valve 43*c* is arranged outside the processing room 201. In detail, the rinse liquid open/close valve 43*c* is housed in the fluid box 102 described with reference to FIG. 1. Also, the rinse liquid supply piping 43*b* is introduced into the inside of the processing room 201 from the outside of the processing room 201. In detail, the rinse liquid supply piping 43*b* is introduced into the inside of the processing room 201 from the fluid box 102.

The third discharge nozzle 43*a* is a stationary nozzle, and discharges a rinse liquid from a predetermined position toward the upper surface of the substrate W that is rotating and that is held by the substrate holding portion 2. As a result, the rinse liquid is supplied to the substrate W, and a liquid film LF2 of the rinse liquid is formed on the upper surface of the substrate W. The rinse liquid supply piping 43*b* supplies the rinse liquid to the third discharge nozzle 43*a*. The rinse liquid open/close valve 43*c* controls the supply of the rinse liquid to the third discharge nozzle 43*a* and the supply stop of the rinse liquid to the third discharge nozzle 43*a*. The third discharge nozzle 43*a*, the rinse liquid supply piping 43*b*, and the rinse liquid open/close valve 43*c* are substantially the same in configuration as the first discharge nozzle 41*a*, the first chemical liquid supply piping 41*b*, and the first chemical liquid open/close valve 41*c*, respectively, and therefore a detailed description of these components is omitted.

The guard portions 6 surround the substrate W held by the substrate holding portion 2, and receive the processing liquid discharged from the substrate W. In this preferred embodiment, the guard portions 6 include a first guard portion 6*a*, a second guard portion 6*b*, and a third guard portion 6*c* as shown in FIG. 2. The first guard portion 6*a*, the second guard portion 6*b*, and the third guard portion 6*c* are arranged outside both the substrate holding portion 2 and the substrate rotating portion 3.

In more detail, the first guard portion 6*a* is a guard portion 6 arranged at an innermost position among the position of the first guard portion 6*a*, the position of the second guard portion 6*b*, and the position of the third guard portion 6*c*. In other words, the guard portion 6 closest to the substrate holding portion 2 and to the substrate rotating portion 3 is the first guard portion 6*a* among the first guard portion 6*a*, the second guard portion 6*b*, and the third guard portion 6*c*.

The second guard portion 6*b* is arranged outside the first guard portion 6*a*. The third guard portion 6*c* is arranged outside the second guard portion 6*b*. In other words, the second guard portion 6*b* is arranged between the first guard portion 6*a* and the third guard portion 6*c*.

The third guard portion 6*c* is a guard portion 6 arranged at an outermost position among the position of the first guard portion 6*a*, the position of the second guard portion 6*b*, and the position of the third guard portion 6*c*. In other words, the guard portion 6 farthest from the substrate holding portion 2 and from the substrate rotating portion 3 is the third guard portion 6*c* among the first guard portion 6*a*, the second guard portion 6*b*, and the third guard portion 6*c*.

In detail, the first guard portion 6*a* has a first guard 61*a*, a first cup 62*a*, and a second cup 62*b*. The second guard portion 6*b* has a second guard 61*b* and a third cup 62*c*. The third guard portion 6*c* has a third guard 61*c*.

The first guard 61*a* has a substantially circular cylindrical shape centering on the first rotational axis AX1, and surrounds the periphery of the substrate holding portion 2 and the periphery of the substrate rotating portion 3. Concretely, the first guard 61*a* has a substantially cylindrical sidewall portion and a substantially cylindrical inclined wall portion. The sidewall portion extends in the up-down direction D1. The inclined wall portion is connected to an upper end of the sidewall portion, and extends obliquely upwardly from the upper end of the sidewall portion toward the first rotational axis AX1. The inclined wall portion is a constituent of an upper portion of the first guard 61*a*.

The first guard 61*a* receives a processing liquid discharged from the substrate W. In detail, the processing liquid discharged from the substrate W is received by an inner wall surface of the first guard 61*a*.

The first cup 62*a* is connected to a lower end portion of the first guard 61*a* (sidewall portion). The first cup 62*a* has an annular shape, and forms a liquid receiving groove, whose upper surface is open and whose shape is circularly annular, inside the first guard 61*a*. In other words, the first cup 62*a* is provided inside the first guard 61*a*. The processing liquid received by the first guard 61*a* (inner wall surface) flows and falls to the first cup 62*a* under its own weight. Also, the processing liquid that has collided with the first guard 61*a* (inner wall surface) and has splashed back falls into the first cup 62*a* under its own weight. As a result, the processing liquid is gathered in the first cup 62*a* (liquid receiving groove).

The second cup 62*b* is connected to an outer wall surface of the first guard 61*a*. In this preferred embodiment, the second cup 62*b* is connected to the lower end portion of the first guard 61*a* (sidewall portion). The second cup 62*b* has an annular shape, and forms a liquid receiving groove, whose upper surface is open and whose shape is circularly annular, outside the first guard 61*a*. In other words, second cup 62*b* is provided outside the first guard 61*a*.

The second guard 61*b* is arranged outside the first guard 61*a*. The second guard 61*b* has a substantially circular cylindrical shape centering on the first rotational axis AX1 in the same way as the first guard 61*a*. The second guard 61*b* is substantially the same in configuration as the first guard 61*a*, and therefore a detailed description of the second guard 61*b* is omitted.

The second guard 61*b* receives a processing liquid discharged from the substrate W. In detail, the processing liquid discharged from the substrate W is received by an inner wall surface of the second guard 61*b*. A lower end of the second guard 61*b* (sidewall portion) is placed inside the second cup 62*b* (liquid receiving groove). The processing liquid received by the second guard 61*b* (inner wall surface) flows and falls to the second cup 62*b* under its own weight. Also, the processing liquid that has collided with the second guard 61*b* (inner wall surface) and has splashed back falls into the second cup 62*b* under its own weight. As a result, the processing liquid is gathered in the second cup 62*b* (liquid receiving groove).

The third cup 62*c* is connected to an outer wall surface of the second guard 61*b*. The third cup 62*c* has an annular shape, and forms a liquid receiving groove, whose upper surface is open and whose shape is circularly annular, outside the second guard 61*b*. In other words, the third cup 62*c* is provided outside the second guard 61*b*.

The third guard 61*c* is arranged outside the second guard 61*b*. The third guard 61*c* has a substantially circular cylindrical shape centering on the first rotational axis AX1 in the same way as the first guard 61*a* and the second guard 61*b*. The third guard 61*c* is substantially the same in configuration as both the first guard 61*a* and the second guard 61*b*, and therefore a detailed description of the third guard 61*c* is omitted.

The third guard 61*c* receives a processing liquid discharged from the substrate W. In detail, the processing liquid discharged from the substrate W is received by an inner wall surface of the third guard 61*c*. A lower end of the third guard 61*c* (sidewall portion) is placed inside the third cup 62*c* (liquid receiving groove). The processing liquid received by the third guard 61*c* (inner wall surface) flows and falls to the third cup 62*c* under its own weight. Also, the processing liquid that has collided with the third guard 61*c* (inner wall surface) and has splashed back falls into the third cup 62*c* under its own weight. As a result, the processing liquid is gathered in the third cup 62*c* (liquid receiving groove).

The elevating/lowering portion 7 individually elevates and lowers the guard portions 6, and switches the guard portion 6 that surrounds the substrate W held by the substrate holding portion 2 among the plurality of the guard portions 6. In this preferred embodiment, the elevating/lowering portion 7 individually elevates and lowers the first guard portion 6*a* to the third guard portion 6*c* in the up-down direction D1. The elevating/lowering portion 7 is controlled by the controller 10 (control portion 11). In detail, the elevating/lowering portion 7 elevates and lowers each of the first to third guard portions 6*a* to 6*c* in the up-down direction D1 between an upper position and a lower position. The upper position is a position higher than the lower position.

The first to third guard portions 6*a* to 6*c* are placed at the lower position, for example, when the substrate W is carried into the processing room 201 by means of the center robot CR (FIG. 1) or when the substrate W is carried out from the inside to the outside of the processing room 201 by means of the center robot CR (FIG. 1). Also, the first to third guard portions 6*a* to 6*c* are placed at the upper position when the processing liquid discharged from the substrate W is received by the first guard portion 6*a* (first guard 61*a*). The first guard portion 6*a* is placed at the lower position, and the second and third guard portions 6*b* and 6*c* are placed at the upper position when the processing liquid discharged from the substrate W is received by the second guard portion 6*b* (second guard 61*b*). The first and second guard portions 6*a* and 6*b* are placed at the lower position, and the third guard portion 6*c* is placed at the upper position when the processing liquid discharged from the substrate W is received by the third guard portion 6*c* (third guard 61*c*).

In this preferred embodiment, the elevating/lowering portion 7 includes a first elevating/lowering portion 71, a second elevating/lowering portion 72, and a third elevating/lowering portion 73 as shown in FIG. 2. The first elevating/lowering portion 71 elevates and lowers the first guard portion 6*a* in the up-down direction D1 between the upper position and the lower position. The second elevating/lowering portion 72 elevates and lowers the second guard portion 6*b* in the up-down direction D1 between the upper position and the lower position. The third elevating/lowering portion 73 elevates and lowers the third guard portion 6*c* in the up-down direction D1 between the upper position and the lower position.

The first to third elevating/lowering portions 71 to 73 are controlled by the controller 10 (control portion 11). The actuator of the first to third elevating/lowering portions 71 to 73 includes, for example, a ball screw mechanism and an electric motor that is rotatable in the forward and reverse directions. The electric motor gives a driving force to the ball screw mechanism. Alternatively, the actuator of the first to third elevating/lowering portions 71 to 73 may include an electric motor that is rotatable in the forward and reverse directions and a speed reducer, or may include a cylinder, such as an air cylinder.

The drainage portion 8 discharges a part of the processing liquid received by the guard portions 6 to the outside of the processing room 201. In other words, the drainage portion 8 discharges a part of the processing liquid, which has been used for substrate processing, to the outside of the processing room 201. In this preferred embodiment, the first chemical liquid (DHF) and the rinse liquid are drained.

Concretely, the drainage portion 8 discharges a processing liquid received by the first guard portion 6*a* (first guard 61*a*) to the outside of the processing room 201. In detail, the drainage portion 8 discharges a processing liquid gathered in the first cup 62*a* to the outside of the processing room 201. Also, the drainage portion 8 discharges a processing liquid received by the third guard portion 6*c* (third guard 61*c*) to the outside of the processing room 201. In detail, the drainage portion 8 discharges a processing liquid gathered in the third cup 62*c* to the outside of the processing room 201.

In this preferred embodiment, the drainage portion 8 includes a first drainage portion 81 and a second drainage portion 82 as shown in FIG. 2. Also, the substrate processing apparatus 100 further includes a drain tank 84. The drain tank 84 is arranged outside the processing room 201.

The first drainage portion 81 discharges a processing liquid gathered in the first cup 62*a* into the drain tank 84. In detail, the first drainage portion 81 has a first drainage piping 81*a* and a first drainage open/close valve 81*b*. The processing room 201 houses a part of the first drainage piping 81*a*. In this preferred embodiment, the first drainage open/close valve 81*b* is arranged outside the processing room 201. The first drainage piping 81*a* is guided from the inside to the outside of the processing room 201.

The first drainage piping 81*a* is, for example, a tube. One end of the first drainage piping 81*a* is connected to a bottom portion of the first cup 62*a*. In detail, the first drainage piping 81*a* communicates with an inner space of the first cup 62*a* (liquid receiving groove). The processing liquid gathered in the first cup 62*a* flows into the first drainage piping 81*a*. The other end of the first drainage piping 81*a* is connected to the drain tank 84.

The first drainage open/close valve 81*b* is interposed in the first drainage piping 81*a*. The first drainage open/close valve 81*b* controls the flow of a processing liquid through the first drainage piping 81*a* and the flow stop of a processing liquid through the first drainage piping 81*a*.

In detail, the first drainage open/close valve 81*b* is switchable between an open state and a closed state. The controller 10 (control portion 11) controls the open/close operation of the first drainage open/close valve 81*b*. The actuator of the first drainage open/close valve 81*b* is, for example, a pneumatic actuator or an electric actuator. When the first drainage open/close valve 81*b* is in an open state, a processing liquid flows to the drain tank 84 through the first drainage piping 81*a*. On the other hand, when the first drainage open/close valve 81*b* is in a closed state, the flow of the processing liquid through the first drainage piping 81*a* is stopped.

The second drainage portion 82 discharges a processing liquid gathered in the third cup 62*c* into the drain tank 84. In detail, the second drainage portion 82 has a second drainage piping 82*a* and a second drainage open/close valve 82*b*. The processing room 201 houses a part of the second drainage piping 82*a*. In this preferred embodiment, the second drainage open/close valve 82*b* is arranged outside the processing room 201. The second drainage piping 82*a* is guided from the inside to the outside of the processing room 201.

One end of the second drainage piping 82*a* is connected to a bottom portion of the third cup 62*c*. A processing liquid gathered in the third cup 62*c* flows into the second drainage piping 82*a*. The other end of the second drainage piping 82*a* is connected to the drain tank 84. The second drainage piping 82*a* is substantially the same in configuration as the first drainage piping 81*a*, and therefore a detailed description of the second drainage piping 82*a* is omitted.

The second drainage open/close valve 82*b* is interposed in the second drainage piping 82*a*. When the second drainage open/close valve 82*b* is in an open state, a processing liquid flows into the drain tank 84 through the second drainage piping 82*a*. On the other hand, when the second drainage open/close valve 82*b* is in a closed state, the flow of a processing liquid through the second drainage piping 82*a* is stopped. The second drainage open/close valve 82*b* is substantially the same in configuration as the first drainage open/close valve 81*b*, and therefore a detailed description of the second drainage open/close valve 82*b* is omitted.

The recovery portion 9 recovers other parts of the processing liquid received by the guard portions 6. Also, the recovery portion 9 allows the processing liquid recovered by the recovery portion 9 to flow to the fluid cabinet 101 described with reference to FIG. 1. As a result, the other parts of the processing liquid that have been used for substrate processing are again housed in the fluid cabinet 101, and are again used for substrate processing in the next and subsequent steps. In this preferred embodiment, the second chemical liquid (TMAH) is recovered, and is reused for substrate processing.

Concretely, the recovery portion 9 recovers a processing liquid received by the second guard portion 6*b* (second guard 61*b*). In detail, the recovery portion 9 recovers a processing liquid gathered in the second cup 62*b*.

In this preferred embodiment, the recovery portion 9 has a recovery piping 91 and a recovery open/close valve 92 as shown in FIG. 2. The processing room 201 houses a part of the recovery piping 91. In this preferred embodiment, the recovery open/close valve 92 is arranged outside the processing room 201. The recovery piping 91 is guided from the inside to the outside of the processing room 201.

One end of the recovery piping 91 is connected to a bottom portion of the second cup 62*b*. A processing liquid gathered in the second cup 62*b* flows into the recovery piping 91. The other end of the recovery piping 91 is connected to the fluid cabinet 101. The recovery piping 91 is substantially the same in configuration as the first drainage piping 81*a* and the second drainage piping 82*a*, and therefore a detailed description of the recovery piping 91 is omitted.

The recovery open/close valve 92 is interposed in the recovery piping 91. When the recovery open/close valve 92 is in an open state, a processing liquid flows to the fluid cabinet 101 through the recovery piping 91. On the other hand, when the recovery open/close valve 92 is in a closed state, the flow of a processing liquid through the recovery piping 91 is stopped. The recovery open/close valve 92 is substantially the same in configuration as the first drainage open/close valve 81*b* and the second drainage open/close valve 82*b*, and therefore a detailed description of the recovery open/close valve 92 is omitted.

Figure 3:
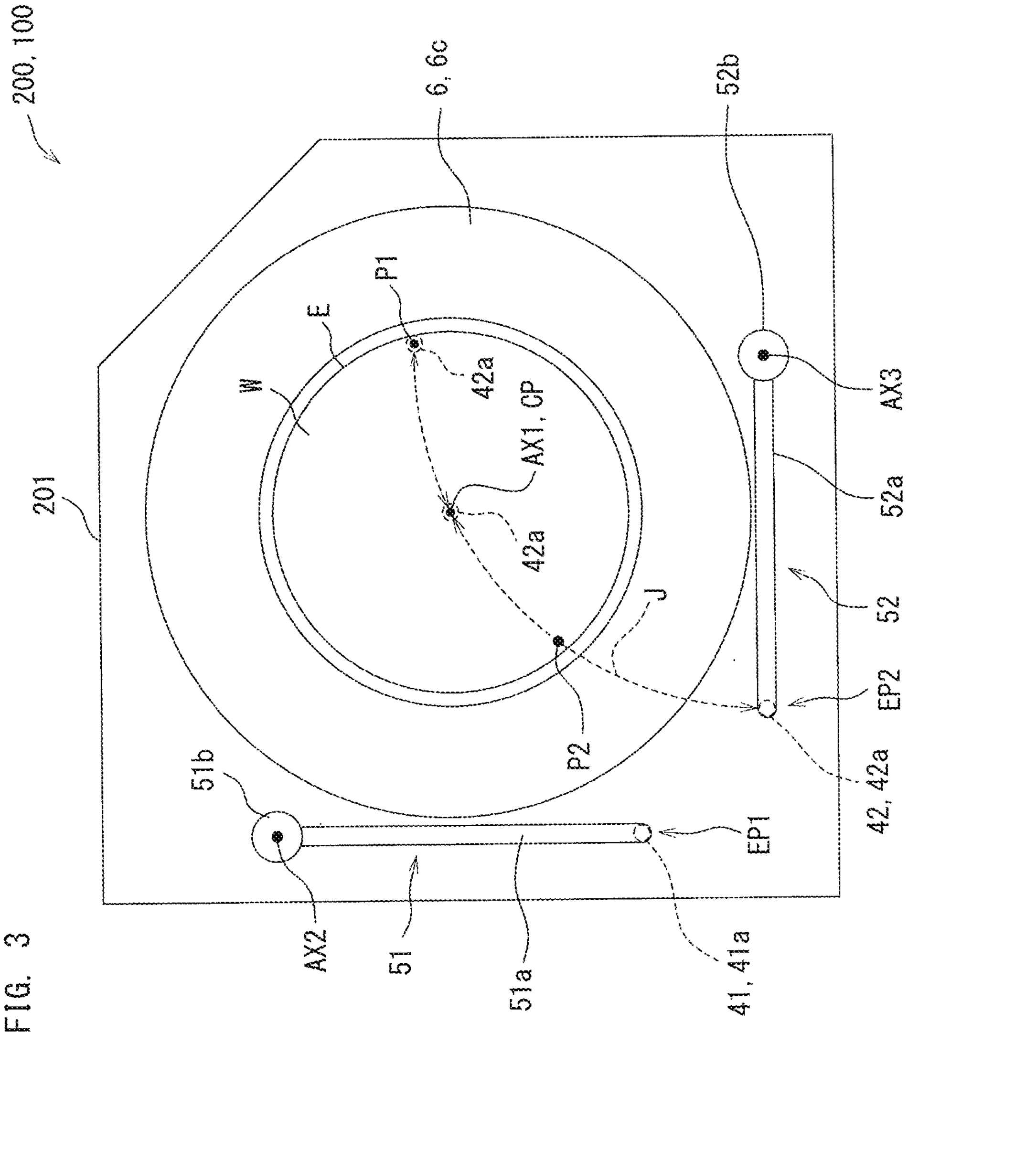
FIG. 3 is a view showing a movement locus of a second discharge nozzle included in the substrate processing apparatus according to the preferred embodiment.

FIG. 3 is a view showing a movement locus J of the second discharge nozzle 42*a* included in the substrate processing apparatus 100 of this preferred embodiment. The second nozzle moving portion 52 horizontally moves the second discharge nozzle 42*a* along a circular-arc movement locus J passing through the center position CP (which is a position facing the center of the substrate W) as shown in FIG. 3.

When the discharge of the second chemical liquid (TMAH) from the second discharge nozzle 42*a* is started, the controller 10 (control portion 11) controls the second nozzle moving portion 52, and moves the second discharge nozzle 42*a* from the second retreat position EP2 to the center position CP. Thereafter, the controller 10 (control portion 11) controls the second chemical liquid supply portion 42, and allows the second chemical liquid supply portion 42 to discharge a second chemical liquid from the second discharge nozzle 42*a*. As a result, the second discharge nozzle 42*a* discharges the second chemical liquid from the center position CP toward the central portion of the substrate W that is rotating.

The controller 10 (control portion 11) controls the second nozzle moving portion 52 in accordance with the lapse of a predetermined period of time from the discharge start of the second chemical liquid, and controls the second chemical liquid supply portion 42 while moving the second discharge nozzle 42*a* above the substrate W held by the substrate holding portion 2, and allows the second chemical liquid supply portion 42 to discharge the second chemical liquid from the second discharge nozzle 42*a*. As a result, the second discharge nozzle 42*a* discharges the second chemical liquid while horizontally moving above the substrate W that is rotating. It should be noted that the controller 10 (control portion 11) allows the second discharge nozzle 42*a* to start moving after the entire part of the upper surface of the substrate W is covered with the second chemical liquid.

In detail, the movement locus J passes through two places (first end portion facing position P1 and second end portion facing position P2) among positions that face the end portion E of the substrate W. The first end portion facing position P1 shows a position, which is one of the first and second end portion facing positions P1 and P2, on the side farther from the second retreat position EP2. The second end portion facing position P2 shows a position, which is one of the first and second end portion facing positions P1 and P2, on the side closer to the second retreat position EP2. In this preferred embodiment, the controller 10 (control portion 11) allows the second discharge nozzle 42*a* to discharge the second chemical liquid while repeatedly moving the second discharge nozzle 42*a* between the center position CP and the first end portion facing position P1. In other words, the controller 10 (control portion 11) allows the second discharge nozzle 42*a* to perform half scanning.

In accordance with the lapse of a predetermined scan processing time after the start of half scanning, the controller 10 (control portion 11) allows the stop of the half scanning. The scan processing time is, for example, 40 seconds. During this time, the second discharge nozzle 42*a* repeatedly moves (reciprocates) between the center position CP and the first end portion facing position P1.

In more detail, the controller 10 (control portion 11) allows the second discharge nozzle 42*a* to stop at the center position CP for a first stopping time, and then allows the second discharge nozzle 42*a* to move to the first end portion facing position P1. Thereafter, the controller 10 (control portion 11) allows the second discharge nozzle 42*a* to stop at the first end portion facing position P1 for a second stopping time, and then allows the second discharge nozzle 42*a* to move to the center position CP. The controller 10 (control portion 11) allows the second discharge nozzle 42*a* to discharge the second chemical liquid while the second discharge nozzle 42*a* stops at the center position CP. The controller 10 (control portion 11) allows the second discharge nozzle 42*a* to discharge the second chemical liquid while the second discharge nozzle 42*a* moves between the center position CP and the first end portion facing position P1. The controller 10 (control portion 11) allows the second discharge nozzle 42*a* to discharge the second chemical liquid while the second discharge nozzle 42*a* stops at the first end portion facing position P1.

The first stopping time is longer than the second stopping time. The first stopping time is, for example, 2 seconds. The second stopping time is 1 second. According to this preferred embodiment, the first stopping time is longer than the second stopping time, and therefore it is difficult for a liquid film to become thin at the central portion of the substrate W during half scanning. In other words, it is difficult for so-called "liquid exhaustion" to occur at the central portion of the substrate W. Therefore, it is possible to maintain coverage during half scanning.

In this preferred embodiment, TMAH whose temperature (40° C.) is equal to or more than room temperature is used as the second chemical liquid as described above. Therefore, if the second chemical liquid is discharged only from the center position CP without allowing the second discharge nozzle 42*a* to perform scanning, there is a possibility that the temperature of the second chemical liquid with which the end portion E of the substrate W is covered will become lower than the temperature of the second chemical liquid with which the central portion of the substrate W is covered. On the other hand, according to this preferred embodiment, the second discharge nozzle 42*a* is allowed to perform scanning when the second chemical liquid is discharged from the second discharge nozzle 42*a*. As a result, it is possible to substantially uniform the temperature of the second chemical liquid (TMAH) being in contact with the substrate W between the central portion and the end portion E of the substrate W.

In this preferred embodiment, the controller 10 (control portion 11) may allow the second discharge nozzle 42*a* to move between the center position CP and the second end portion facing position P2 although the controller 10 (control portion 11) allows the second discharge nozzle 42*a* to move between the center position CP and the first end portion facing position P1. Alternatively, the controller 10 (control portion 11) may allow the second discharge nozzle 42*a* to move between the first end portion facing position P1 and the second end portion facing position P2. In other words, the controller 10 (control portion 11) may allow the second discharge nozzle 42*a* to perform full scanning. In this case, the second discharge nozzle 42*a* may be temporarily stopped at the center position CP during the full scanning.

Next, the movement of the first discharge nozzle 41*a* will be described with reference to FIG. 3. The first nozzle moving portion 51 horizontally moves the first discharge nozzle 41*a* along the circular-arc movement locus passing through the center position CP in the same way as the second nozzle moving portion 52.

When the first discharge nozzle 41*a* starts discharging the first chemical liquid (DHF) from the first discharge nozzle 41*a*, the controller 10 (control portion 11) controls the first nozzle moving portion 51, and moves the first discharge nozzle 41*a* from the first retreat position EP1 to the center position CP. Thereafter, the controller 10 (control portion 11) controls the first chemical liquid supply portion 41, and allows the first chemical liquid supply portion 41 to discharge the first chemical liquid from the first discharge nozzle 41*a*. As a result, the first discharge nozzle 41*a* discharges the first chemical liquid from the center position CP toward the central portion of the substrate W that is rotating.

Figure 4A:
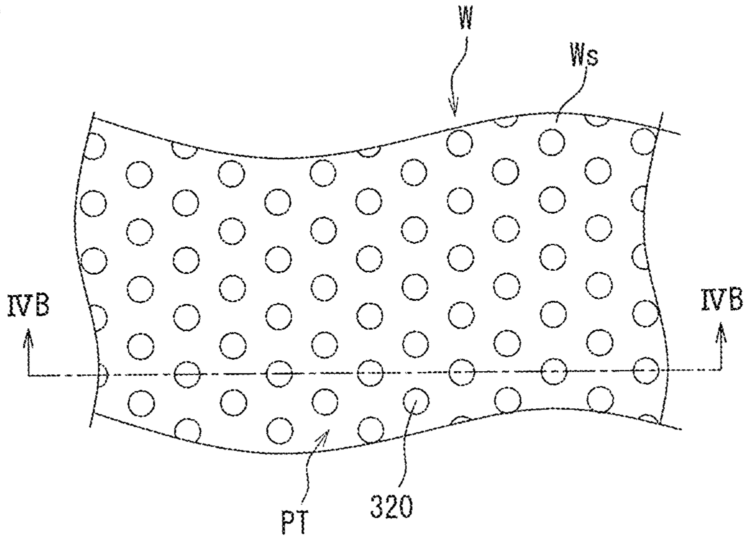
FIG. 4A is an enlarged plan view that schematically shows an example of a substrate that is processed by the substrate processing apparatus according to the preferred embodiment.
Figure 4B:
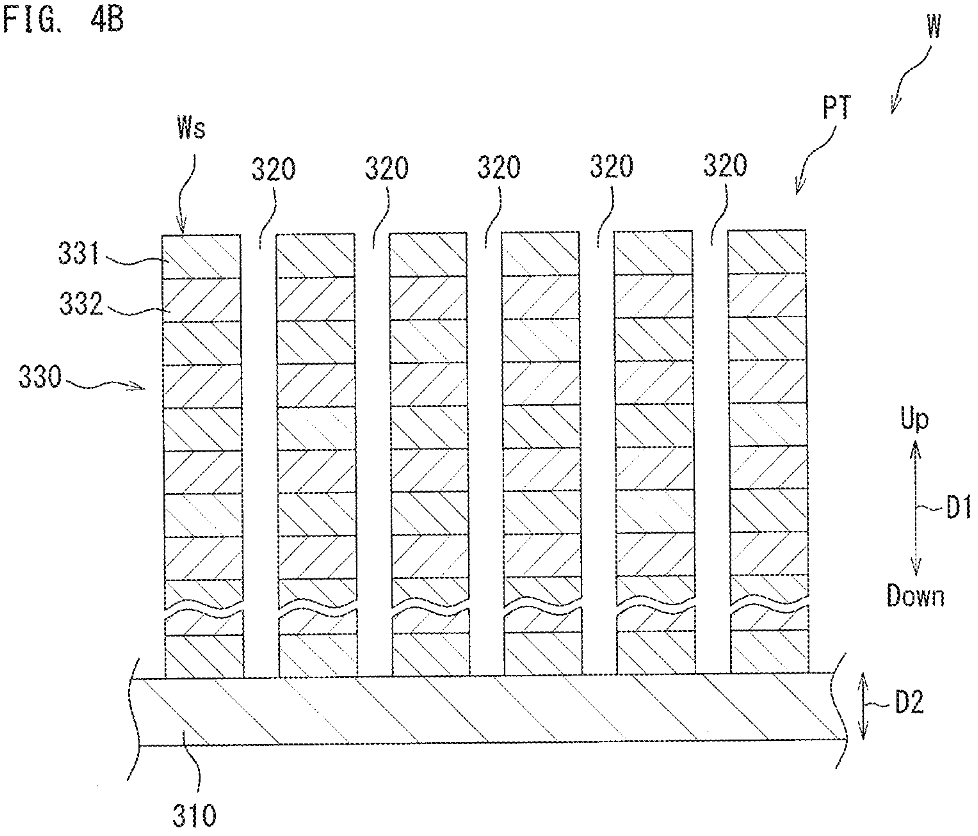
FIG. 4B is an enlarged cross-sectional view that schematically shows an example of a substrate that is processed by the substrate processing apparatus according to the preferred embodiment.

Next, an example of a substrate W that is processed by the substrate processing apparatus 100 will be described with reference to FIG. 4A and FIG. 4B. FIG. 4A is an enlarged plan view that schematically shows an example of a substrate W that is processed by the substrate processing apparatus 100 of this preferred embodiment. In detail, FIG. 4A is shown by enlarging a part of an upper surface of the substrate W. FIG. 4B is an enlarged cross-sectional view that schematically shows an example of a substrate W that is processed by the substrate processing apparatus 100 of this preferred embodiment. In detail, FIG. 4B shows a cross section of the substrate W cut along section line IVB-IVB of FIG. 4A.

The substrate W has a pattern PT as shown in FIG. 4A. The pattern PT includes a plurality of recess portions 320. Each of the recess portions 320 has an opening portion in a topmost surface Ws of the substrate W. In more detail, the substrate W has a silicon substrate 310 and the pattern PT as shown in FIG. 4B. The pattern PT is formed on the silicon substrate 310.

In detail, the pattern PT includes a multi-layer laminated structure 330 and the plurality of recess portions 320. The laminated structure 330 includes a plurality of silicon oxide layers 331 and a plurality of polysilicon layers 332. The silicon oxide layers 331 and the polysilicon layers 332 are laminated in a thickness direction D2 of the substrate W so that the silicon oxide layer 331 and the polysilicon layer 332 are laminated in an alternating manner. The thickness direction D2 shows a direction that substantially perpendicularly intersects the surface of the silicon substrate 310. The thickness direction D2 is substantially parallel to the up-down direction D1 in a state in which the substrate W is held by the substrate holding portion 2.

Each of the recess portions 320 is recessed in the thickness direction D2 of the substrate W from the topmost surface Ws of the substrate W toward the silicon substrate 310. In other words, each of the recess portions 320 is recessed in a lamination direction that is a direction in which the silicon oxide layer 331 and the polysilicon layer 332 are alternately laminated. Each of the recess portions 320 passes through the laminated structure 330 in the thickness direction D2 (lamination direction). In other words, each of the recess portions 320 extends from the topmost surface Ws of the substrate W to the silicon substrate 310. Therefore, the deepest portion of each of the recess portions 320 is contiguous to an upper surface of the silicon substrate 310. As long as the recess portion 320 is recessed from the topmost surface Ws of the substrate W, the recess portion 320 may be a trench or a hole, and specific limitations are not imposed thereon.

Figure 5C:
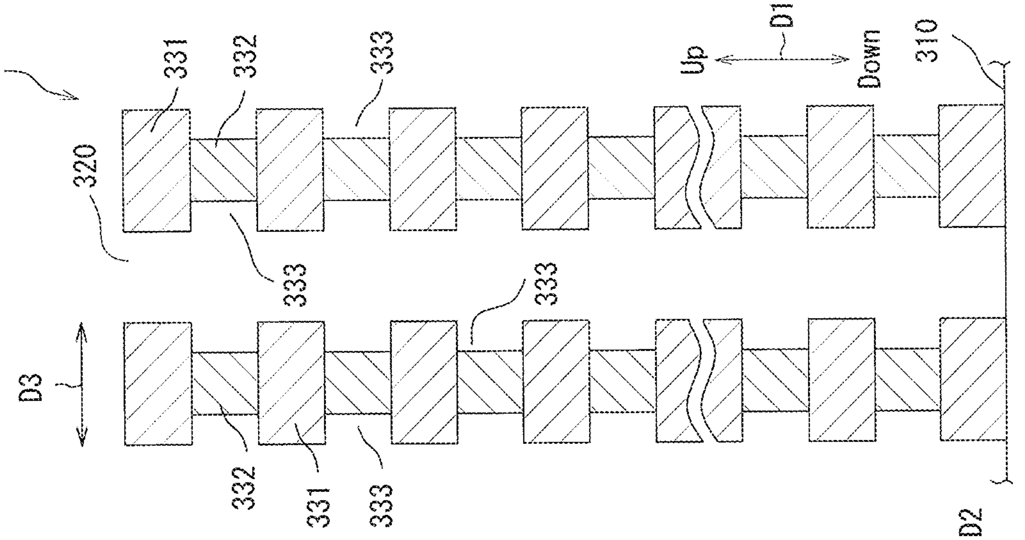
FIG. 5C is an enlarged cross-sectional view that schematically shows a part of the substrate that has been processed.
Figure 5B:
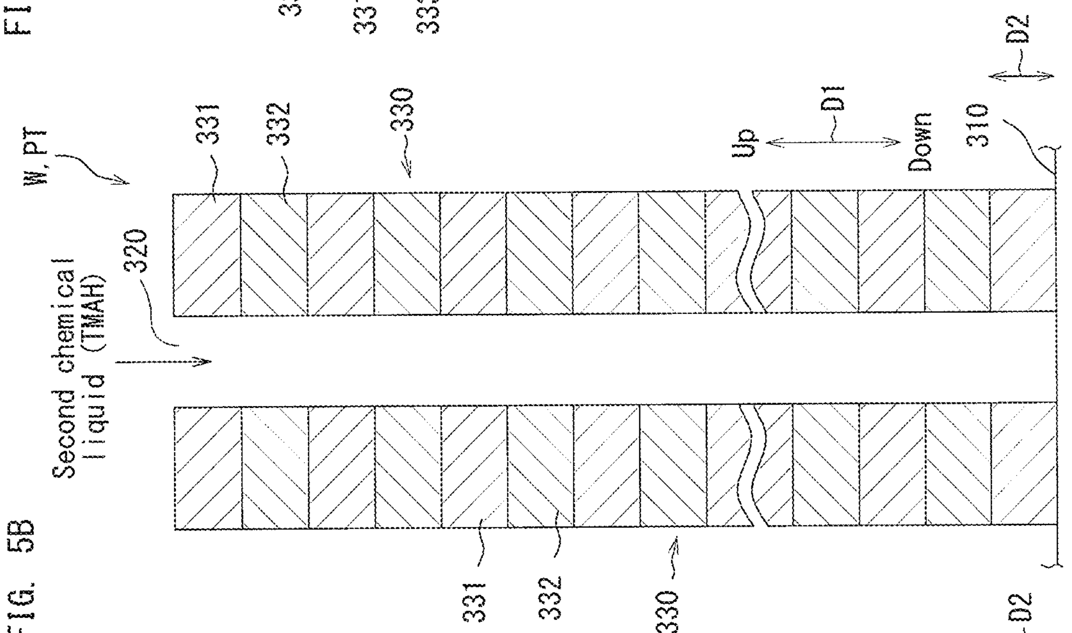
FIG. 5B is an enlarged cross-sectional view that schematically shows a part of the substrate to which a second chemical liquid has not yet been supplied.
Figure 5A:
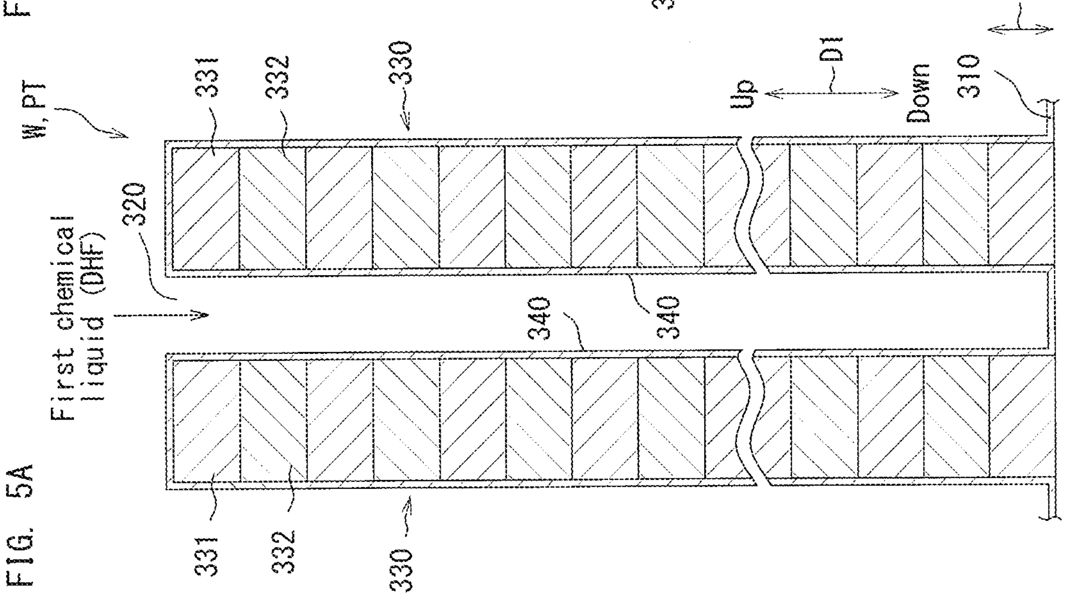
FIG. 5A is an enlarged cross-sectional view that schematically shows a part of the substrate to which a first chemical liquid has not yet been supplied.

Next, substrate processing that is performed by the substrate processing apparatus 100 will be described with reference to FIG. 5A and FIG. 5C. FIG. 5A is an enlarged cross-sectional view that schematically shows a part of the substrate W to which the first chemical liquid (DHF) has not yet been supplied. FIG. 5B is an enlarged cross-sectional view that schematically shows a part of the substrate W to which the second chemical liquid (TMAH) has not yet been supplied. FIG. 5C is an enlarged cross-sectional view that schematically shows a part of the substrate W that has been subjected to substrate processing.

The natural oxide film 340 is formed on a surface layer of each of the silicon oxide layers 331, a surface layer of each of the polysilicon layers 332, and a surface layer of the silicon substrate 310 before substrate processing is performed as shown in FIG. 5A. First, the substrate processing apparatus 100 supplies the first chemical liquid (DHF) to the upper surface of the substrate W. As a result, the natural oxide film 340 is removed from the substrate W, and a side surface of each of the silicon oxide layers 331 and a side surface of each of the polysilicon layers 332 are exposed from an inner surface of each of the recess portions 320 as shown in FIG. 5B.

The substrate processing apparatus 100 supplies the second chemical liquid (TMAH) to the upper surface of the substrate W from which the natural oxide film 340 has been removed. As a result, the polysilicon layers 332 among the silicon oxide layers 331 and the polysilicon layers 332 are selectively etched, and dents 333 are formed on the inner surface of each of the recess portions 320 as shown in FIG. 5C. Each of the dents 333 is recessed in a plane direction D3 of the substrate W. The plane direction D3 shows a lateral direction that substantially perpendicularly intersects the thickness direction D2 (lamination direction) of the substrate W.

The substrate W may have, for example, a pattern PT having a high aspect ratio. The aspect ratio of the pattern PT denotes the ratio of the depth in the thickness direction D2 to the width in the plane direction D3 of the recess portion 320. The pattern PT having a high aspect ratio includes the laminated structure 330 that has, for example, eighty or more layers.

Figure 6:
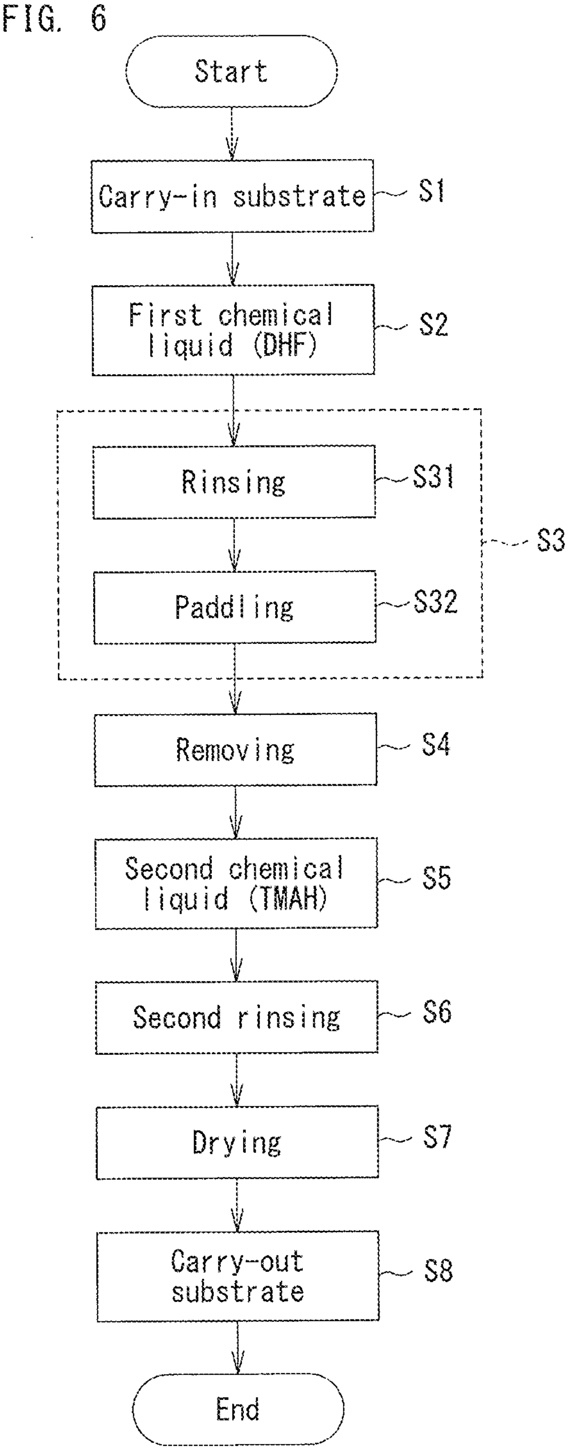
FIG. 6 is a flowchart showing a flow of a substrate processing method according to the preferred embodiment.

Next, the substrate processing apparatus 100 and the substrate processing method of this preferred embodiment will be described with reference to FIG. 1 to FIG. 15. The substrate processing method of this preferred embodiment is performed by the substrate processing apparatus 100 described with reference to FIG. 1 to FIG. 5. FIG. 6 is a flowchart showing a flow of the substrate processing method of this preferred embodiment. In detail, FIG. 6 shows a flow of steps performed by the controller 10 (control portion 11) included in the substrate processing apparatus 100 of this preferred embodiment.

The substrate processing method of this preferred embodiment includes step S1 (substrate carry-in step), step S2 (first chemical liquid step), step S3 (first rinsing step), step S4 (removal step), step S5 (second chemical liquid step), step S6 (second rinsing step), step S7 (drying step), and step S8 (substrate carry-out step) as shown in FIG. 6.

A substrate carry-in processing is performed by the controller 10 (control portion 11) in step S1. First chemical liquid processing is performed by the controller 10 (control portion 11) in step S2. First rinse processing is performed by the controller 10 (control portion 11) in step S3. A removal processing is performed by the controller 10 (control portion 11) in step S4. Second chemical liquid processing is performed by the controller 10 (control portion 11) in step S5. Second rinse processing is performed by the controller 10 (control portion 11) in step S6. Drying processing is performed by the controller 10 (control portion 11) in step S7. A substrate carry-out processing is performed by the controller 10 (control portion 11) in step S8.

Figure 7A:
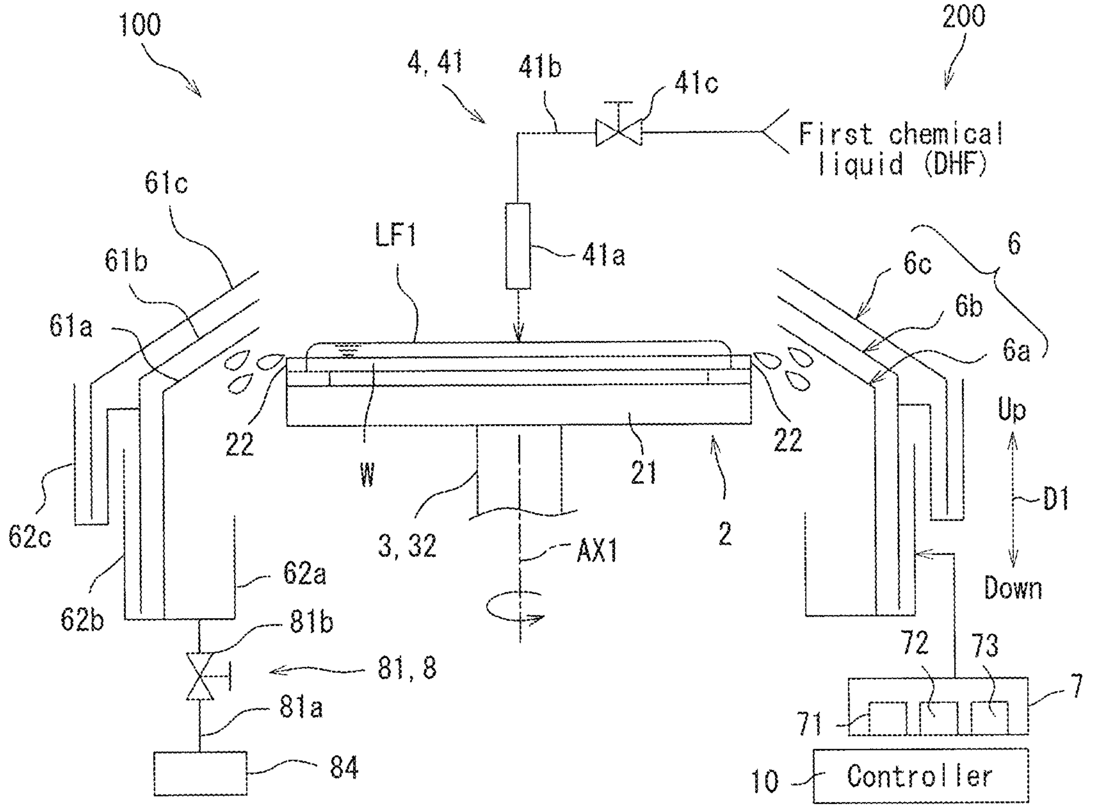
FIG. 7A is a view that schematically shows the substrate processing portion when a first chemical liquid processing is performed.
Figure 7B:
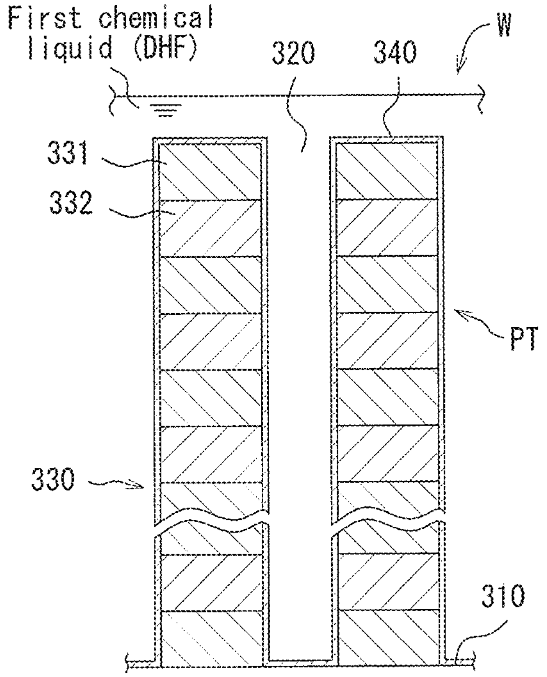
FIG. 7B is an enlarged cross-sectional view that schematically shows a part of the substrate when the first chemical liquid processing is performed.
Figure 8A:
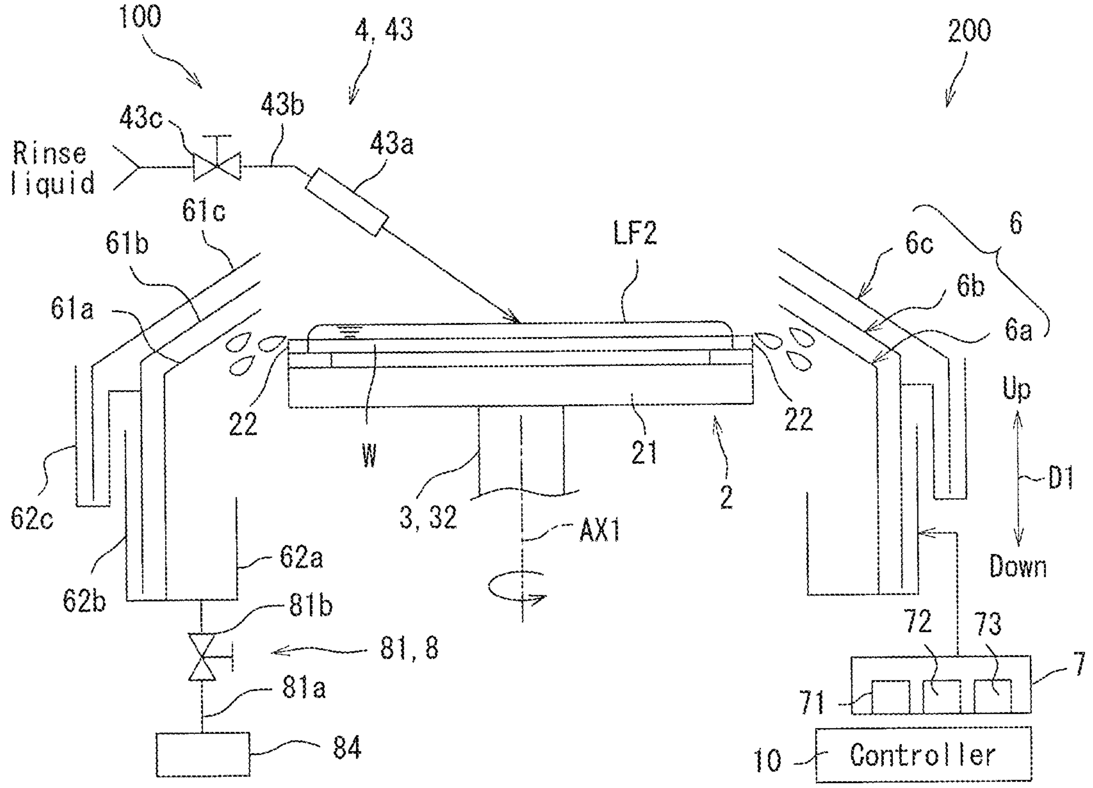
FIG. 8A is a view that schematically shows a first state of the substrate processing portion when a first rinse processing is performed.
Figure 8B:
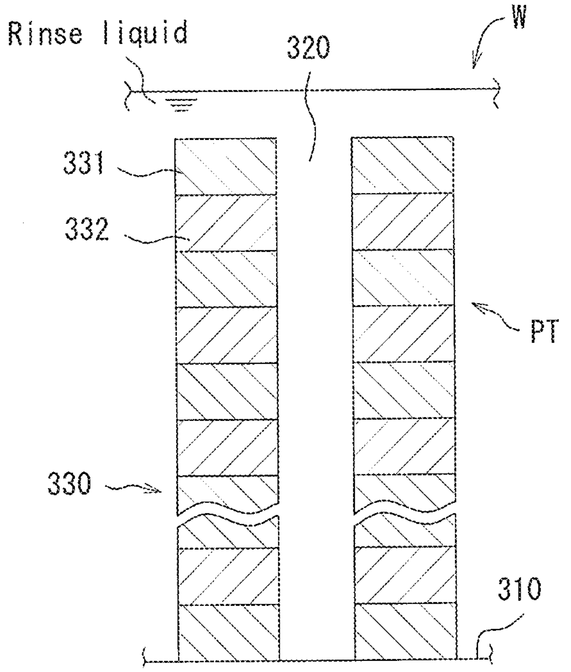
FIG. 8B is an enlarged cross-sectional view that schematically shows a part of the substrate when the first rinse processing is performed.
Figure 9A:
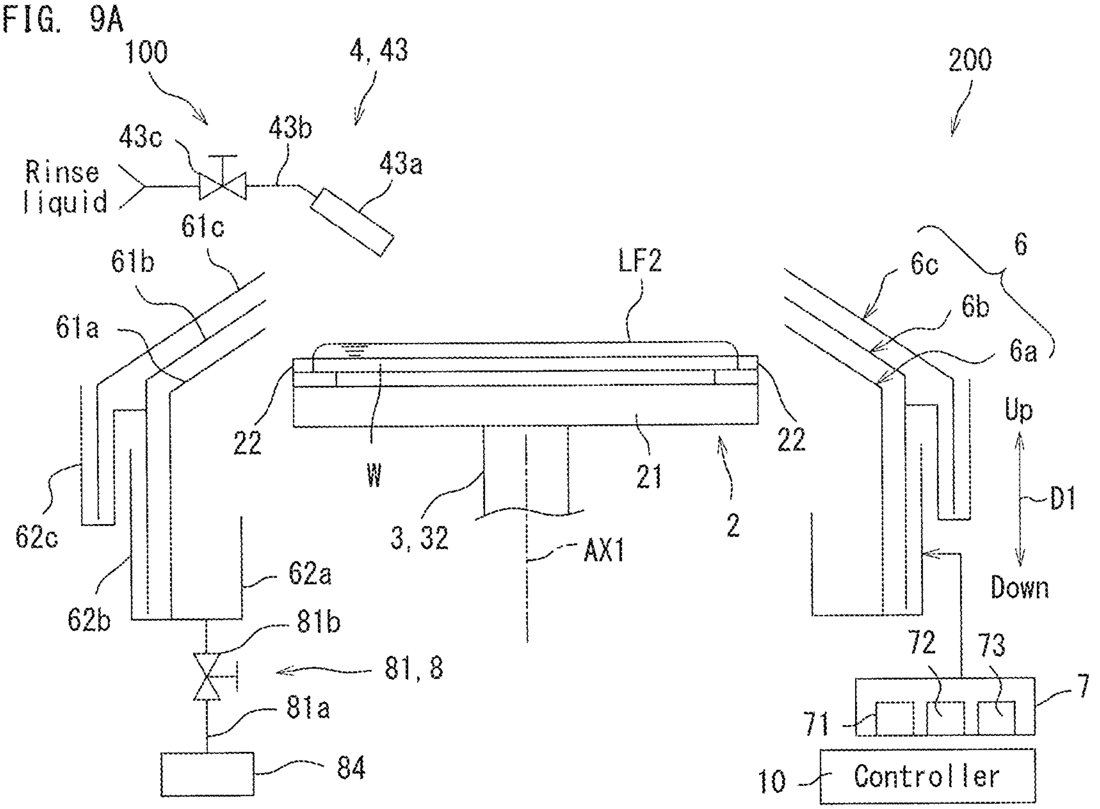
FIG. 9A is a view that schematically shows a second state of the substrate processing portion when the first rinse processing is performed.
Figure 9B:
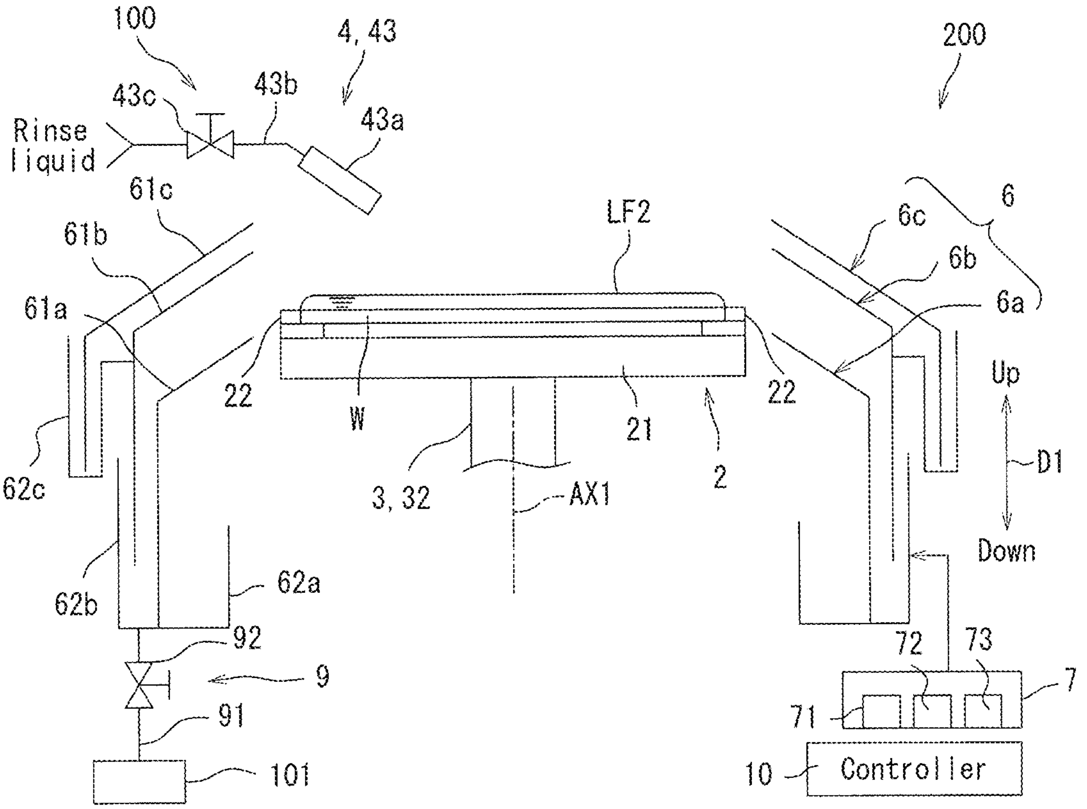
FIG. 9B is a view that schematically shows a third state of the substrate processing portion when the first rinse processing is performed.
Figure 10:
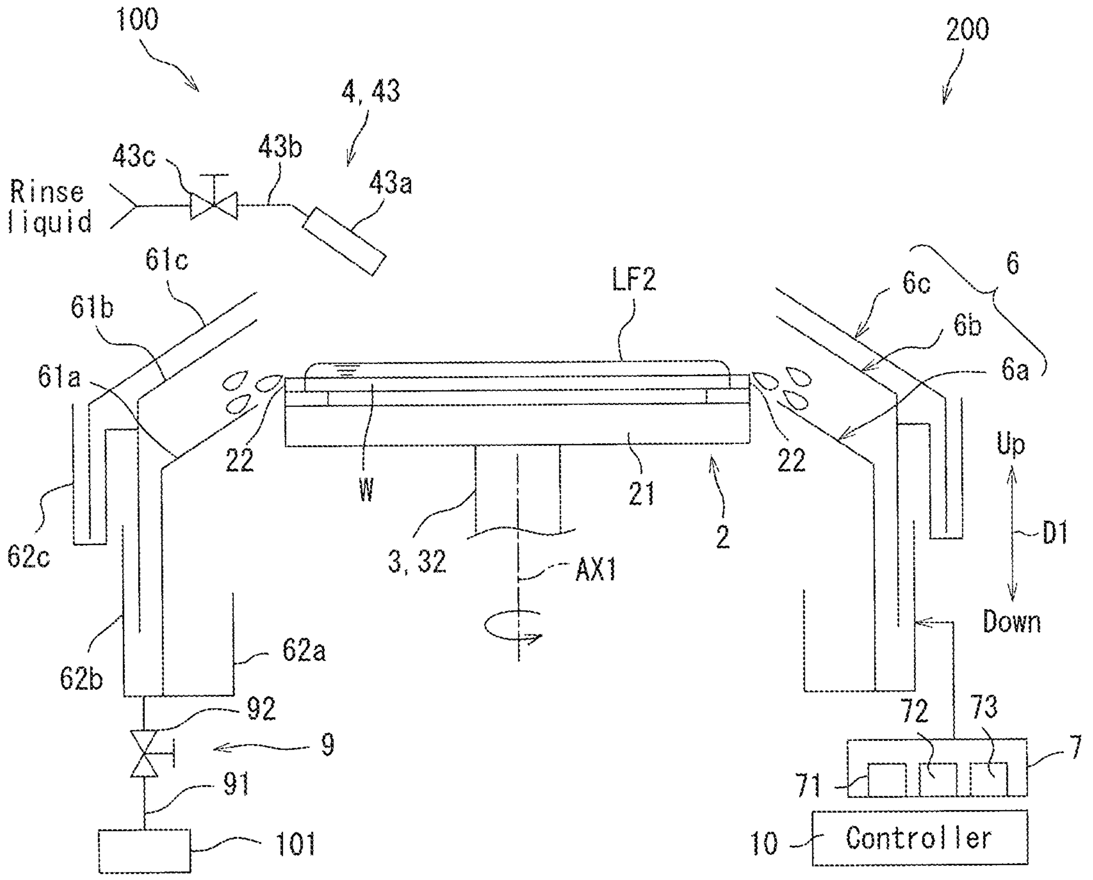
FIG. 10 is a view that schematically shows the substrate processing portion when a removing processing is performed.
Figure 11A:
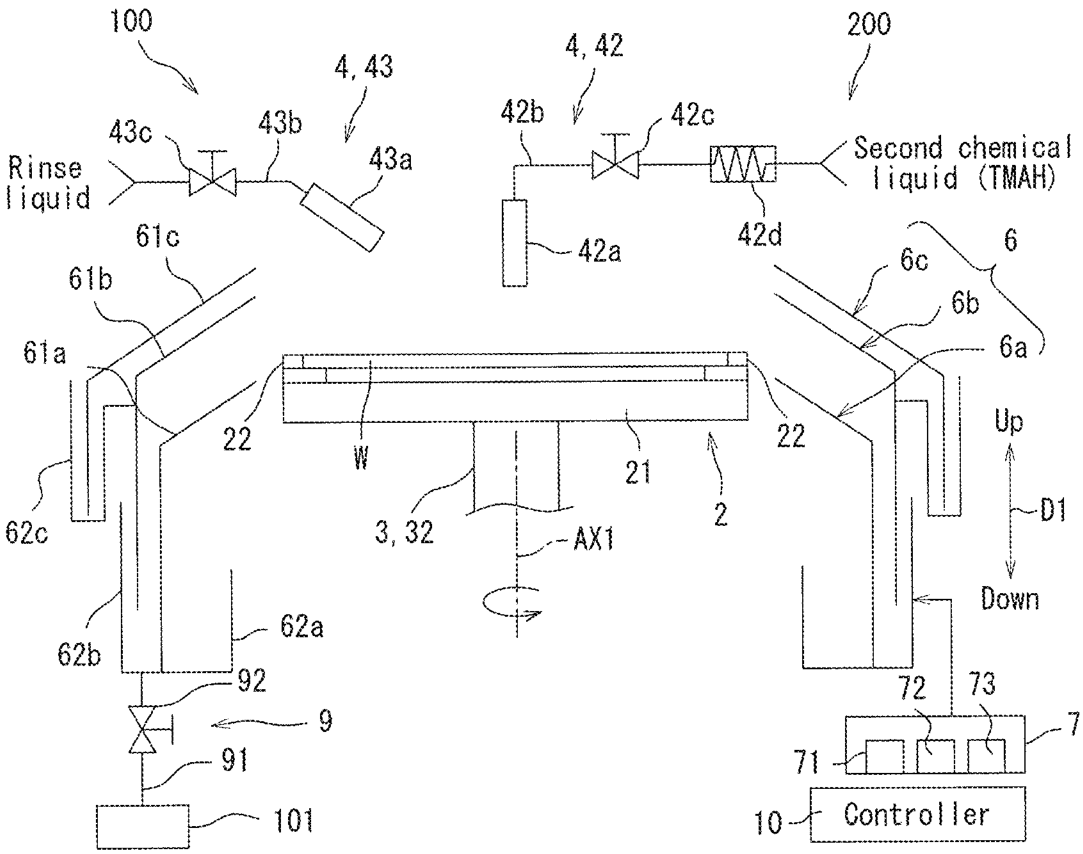
FIG. 11A is a view that schematically shows the substrate processing portion when the removing processing is finished.
Figure 11B:
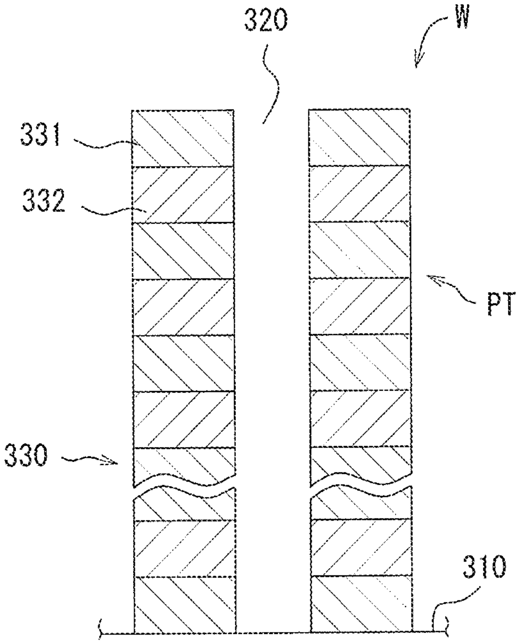
FIG. 11B is an enlarged cross-sectional view that schematically shows a part of the substrate when the removing processing is finished.
Figure 12A:
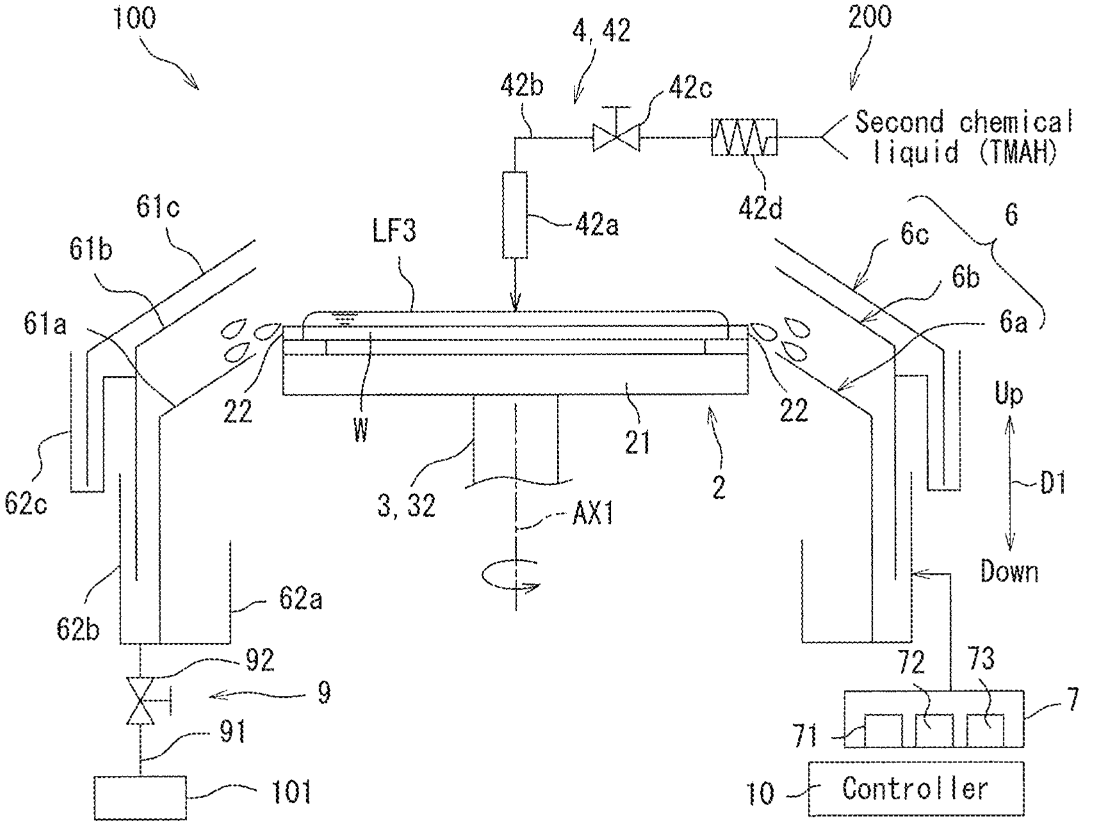
FIG. 12A is a view that schematically shows the substrate processing portion when a second chemical liquid processing is started.
Figure 12B:
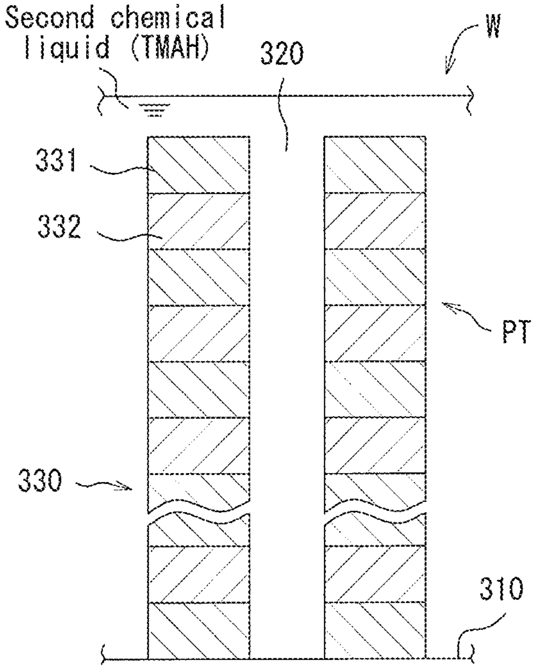
FIG. 12B is an enlarged cross-sectional view that schematically shows a part of the substrate when the second chemical liquid processing is started.
Figure 13:
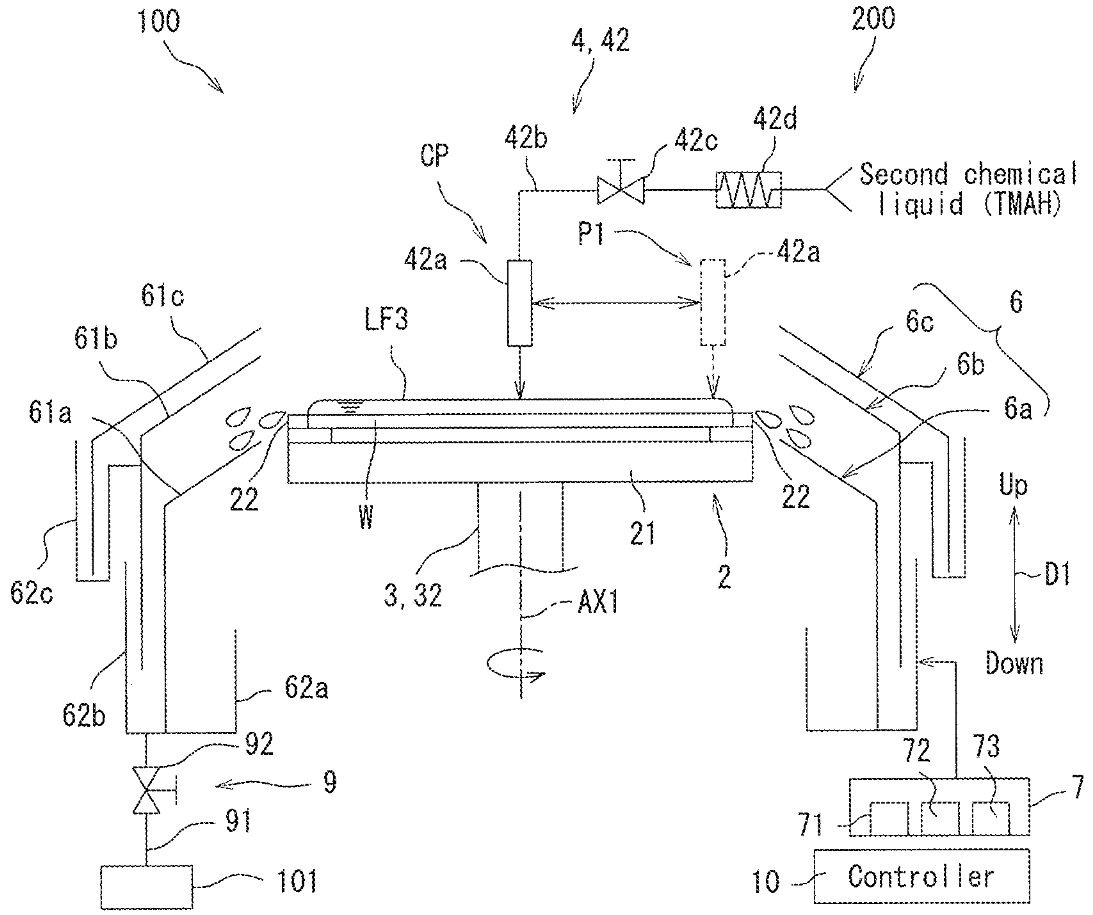
FIG. 13 is a view that schematically shows the substrate processing portion when a scan processing is performed.
Figure 14:
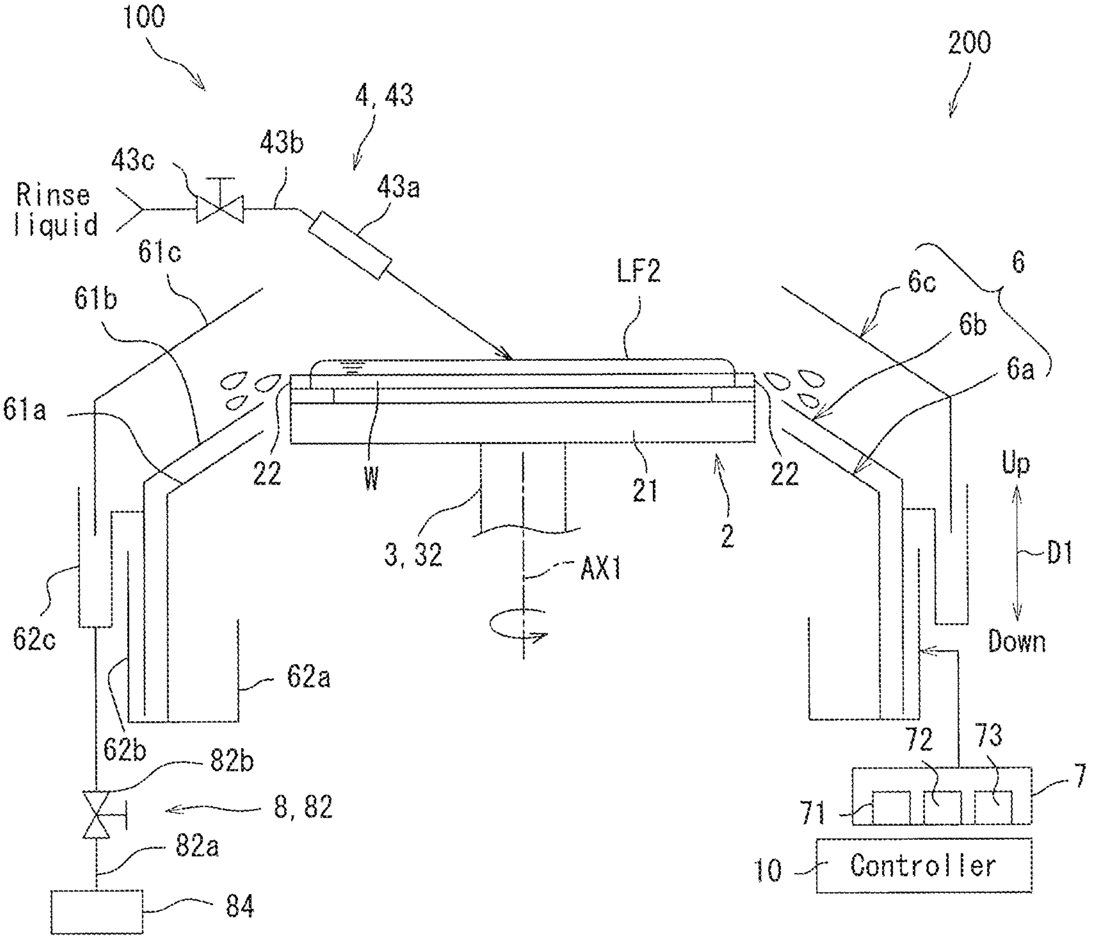
FIG. 14 is a view that schematically shows the substrate processing portion when a second rinse processing is performed.
Figure 15:
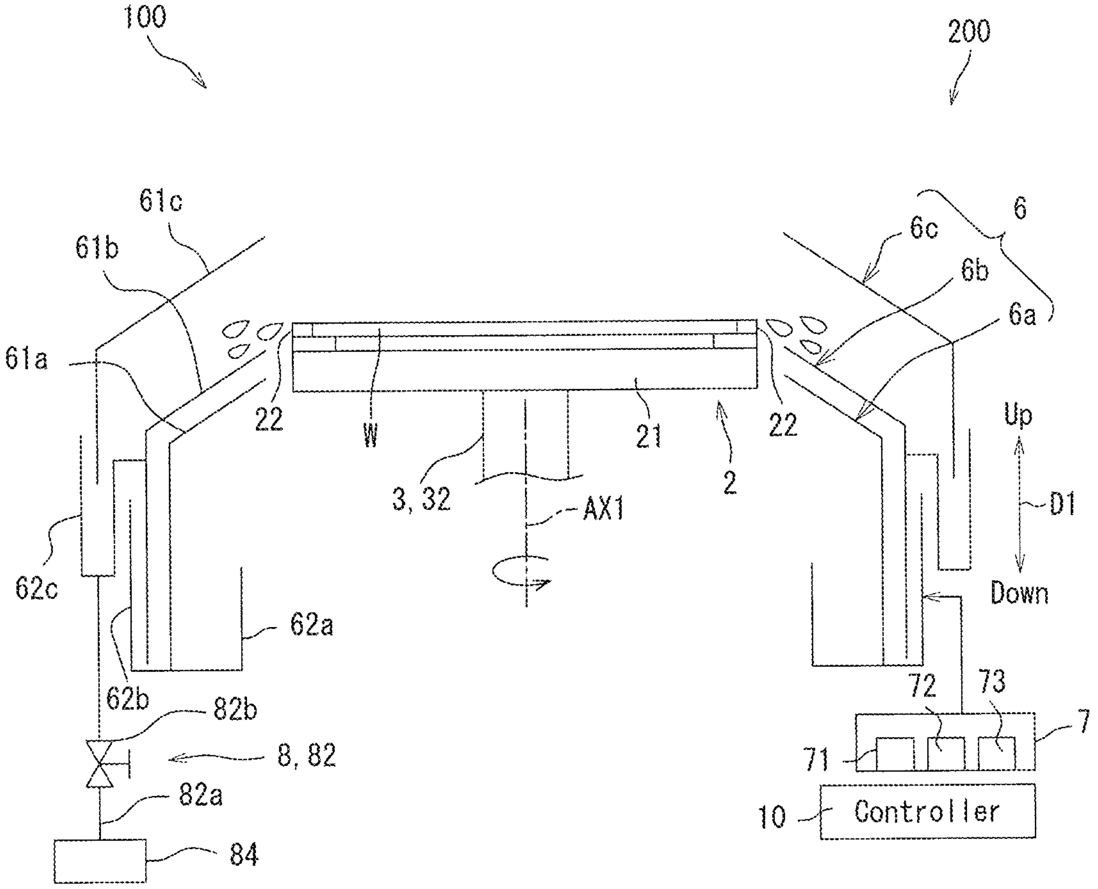
FIG. 15 is a view that schematically shows the substrate processing portion when a drying processing is performed.

FIG. 7A is a view that schematically shows a substrate processing portion 200 during the first chemical liquid processing. FIG. 7B is an enlarged cross-sectional view that schematically shows a part of the substrate W during the first chemical liquid processing. FIG. 8A is a view that schematically shows a first state of the substrate processing portion 200 during the first rinsing. FIG. 8B is an enlarged cross-sectional view that schematically shows a part of the substrate W during the first rinsing. FIG. 9A is a view that schematically shows a second state of the substrate processing portion 200 during the first rinsing. FIG. 9B is a view that schematically shows a third state of the substrate processing portion 200 during the first rinsing. FIG. 10 is a view that schematically shows the substrate processing portion 200 during the removal processing. FIG. 11A is a view that schematically shows the substrate processing portion 200 when the removal processing is ended. FIG. 11B is an enlarged cross-sectional view that schematically shows a part of the substrate W when the removal processing is ended. FIG. 12A is a view that schematically shows the substrate processing portion 200 when the second chemical liquid processing is started. FIG. 12B is an enlarged cross-sectional view that schematically shows a part of the substrate W during the second chemical liquid processing. FIG. 13 is a view that schematically shows the substrate processing portion 200 during the scan processing. FIG. 14 is a view that schematically shows the substrate processing portion 200 during the second rinsing. FIG. 15 is a view that schematically shows the substrate processing portion 200 during the drying processing.

Processing shown in FIG. 6 is started after the center robot CR receives a substrate W from the indexer robot IR. When the center robot CR receives the substrate W from the indexer robot IR, the controller 10 (control portion 11) performs substrate carry-in processing (step S1) as shown in FIG. 6.

Concretely, the controller 10 (control portion 11) controls the center robot CR, and allows the center robot CR to carry the substrate W into the processing room 201. Thereafter, the controller 10 (control portion 11) controls the substrate holding portion 2, and allows the substrate holding portion 2 to hold the substrate W carried into by the center robot CR. As a result, the substrate W is horizontally held by the substrate holding portion 2 in the processing room 201. The substrate W has the pattern PT including the recess portions 320 as described with reference to FIG. 1 to FIG. 5.

When the substrate W is held, the controller 10 (control portion 11) performs the first chemical liquid processing (step S2). The first chemical liquid processing shows processing in which the first chemical liquid (DHF) is supplied to the substrate W while controlling the processing liquid supply portion 4 (first chemical liquid supply portion 41). The natural oxide film 340 is removed from the substrate W by supplying the first chemical liquid (DHF) to the substrate W as described with reference to FIG. 5A and FIG. 5B.

Concretely, when the substrate W is held by the substrate holding portion 2, the controller 10 (control portion 11) controls the substrate rotating portion 3, and allows the substrate rotating portion 3 to rotate the substrate W at a first rotation speed as shown in FIG. 7A. The rotation speed shows a rotational speed per unit time. The first rotation speed is, for example, 800 rpm.

When the substrate W is held by the substrate holding portion 2, the controller 10 (control portion 11) controls the elevating/lowering portion 7, and allows the elevating/lowering portion 7 to move the first to third guard portions **6*a* to 6*c* from the lower position to the upper position. Also, the controller 10 (control portion 11) controls the first nozzle moving portion 51, and allows the first nozzle moving portion 51 to move the first discharge nozzle 41*a* from the first retreat position EP1 to the center position CP. Thereafter, the controller 10 (control portion 11) controls the first chemical liquid supply portion 41, and allows the first chemical liquid supply portion 41 to discharge the first chemical liquid from the first discharge nozzle 41*a*. As a result, the first chemical liquid is supplied to the upper surface of the substrate W that is rotating, and a liquid film LF1** of the first chemical liquid is formed on the upper surface of the substrate W.

The first chemical liquid discharged from the rotating substrate W during the first chemical liquid processing is received by the first guard portion **6*a* (first guard 61*a*). The first chemical liquid received by the first guard portion 6*a* is discharged into the drain tank 84 by means of the first drainage portion 81**.

The first chemical liquid processing is performed, and the first chemical liquid is supplied to the substrate W, and, as a result, the liquid film LF1 of the first chemical liquid is formed, and the first chemical liquid enters the inside of each of the recess portions 320 as shown in FIG. 7B. As a result, the natural oxide film 340 formed on the surface layer of each of the silicon oxide layers 331, on the surface layer of each of the polysilicon layers 332, and on the surface layer of the silicon substrate 310 is removed by the first chemical liquid (DHF).

The controller 10 (control portion 11) performs the first rinse processing in accordance with the lapse of a predetermined first set time after the first chemical liquid processing is started (step S3 of FIG. 6). The first rinse processing shows processing in which a rinse liquid (first rinse liquid) is supplied to the substrate W while controlling the processing liquid supply portion 4 (rinse liquid supply portion 43). The first chemical liquid is washed away from the substrate W by means of the first rinse processing.

Concretely, the controller 10 (control portion 11) controls the first chemical liquid supply portion 41, and allows the first chemical liquid supply portion 41 to stop the supply of the first chemical liquid, and then controls the first nozzle moving portion 51, and allows the first nozzle moving portion 51 to move the first discharge nozzle **41*a* from the center position CP to the first retreat position EP1 as shown in FIG. 8A. Also, the controller 10 (control portion 11) controls the substrate rotating portion 3, and allows the substrate rotating portion 3 to rotate the substrate W at a second rotation speed. Thereafter, the controller 10 (control portion 11) controls the rinse liquid supply portion 43, and allows the rinse liquid supply portion 43 to discharge a rinse liquid from the third discharge nozzle 43*a*. In this preferred embodiment, the second rotation speed is the same rotation speed as the first rotation speed. In other words, the controller 10 (control portion 11**) maintains the rotation speed of the substrate W.

The first rinse processing is performed, and the rinse liquid is supplied to the upper surface of the substrate W that is rotating, and, as a result, the first chemical liquid is washed away from the substrate W, and a liquid film LF2 of the rinse liquid is formed on the upper surface of the substrate W. In detail, the rinse liquid enters the inside of each of the recess portions 320, and, as a result, the first chemical liquid is discharged from each of the recess portions 320, and the first chemical liquid is washed away from the substrate W as shown in FIG. 8B.

The first chemical liquid and the rinse liquid that have been discharged from the rotating substrate W during the first rinse processing are received by the first guard portion **6*a* (first guard 61*a*). The first chemical liquid and the rinse liquid that have been received by the first guard portion 6*a* are discharged into the drain tank 84 by means of the first drainage portion 81**.

In accordance with the lapse of a predetermined period of time from the start of the first rinse processing, the controller 10 (control portion 11) controls the elevating/lowering portion 7, and the guard portion 6 surrounding the substrate W is switched from the first guard portion 6*a* (first guard 61*a*) to the second guard portion 6*b* (second guard 61*b*). Processing in which the guard portion 6 surrounding the substrate W is switched from the first guard portion 6*a* (first guard 61*a*) to the second guard portion 6*b* (second guard 61*b*) is hereinafter referred to at times as a "first guard switching processing."

In this preferred embodiment, step S3 (first rinsing step) includes step S31 and step S32 as shown in FIG. 6. Concretely, the controller 10 (control portion 11) first controls the substrate rotating portion 3, and allows the substrate rotating portion 3 to rotate the substrate W at the second rotation speed, and controls the processing liquid supply portion 4 (rinse liquid supply portion 43), and allows the processing liquid supply portion 4 to supply the rinse liquid to the substrate W that is rotating (step S31). As a result, the first chemical liquid is washed away from the substrate W, and a liquid film LF2 of the rinse liquid is formed on the upper surface of the substrate W.

The controller 10 (control portion 11) performs paddle processing in accordance with the lapse of a predetermined second set time after the supply of the rinse liquid is started (step S32). The paddle processing shows processing in which the liquid film LF2 of the rinse liquid is held on the substrate W.

In this preferred embodiment, the controller 10 (control portion 11) controls the rinse liquid supply portion 43, and allows the rinse liquid supply portion 43 to stop the supply of the rinse liquid as shown in FIG. 9A. Also, the controller 10 (control portion 11) controls the substrate rotating portion 3, and allows the substrate rotating portion 3 to stop the rotation of the substrate W. As a result, the liquid film LF2 of the rinse liquid is held on the substrate W.

The controller 10 (control portion 11) performs the first guard switching processing during the paddle processing as shown in FIG. 9B. In other words, the controller 10 (control portion 11) controls the elevating/lowering portion 7, and allows the elevating/lowering portion 7 to switch the guard portion 6 surrounding the substrate W from the first guard portion 6*a* (first guard 61*a*) to the second guard portion 6*b* (second guard 61*b*). Concretely, the controller 10 (control portion 11) controls the first elevating/lowering portion 71, and allows the first elevating/lowering portion 71 to move the first guard portion 6*a* (first guard 61*a*) from the upper position to the lower position.

The controller 10 (control portion 11) performs removal processing in which the rinse liquid is removed from the substrate W in accordance with the lapse of a predetermined third set time after the paddle processing is started (step S4 of FIG. 6).

Concretely, the controller 10 (control portion 11) controls the processing liquid supply portion 4 (rinse liquid supply portion 43), and a state is maintained in which the supply of the rinse liquid is stopped, and the controller 10 (control portion 11) controls the substrate rotating portion 3, and allows the substrate rotating portion 3 to rotate the substrate W at a third rotation speed as shown in FIG. 10. The third rotation speed is, for example, 800 rpm. As a result, the rinse liquid is removed from the substrate W as shown in FIG. 11A. In detail, a state is reached in which the rinse liquid is discharged from each of the recess portions 320, and does not remain in each of the recess portions 320 as shown in FIG. 11B. Unlike the drying processing, the substrate W is not dried by the removal processing.

The rinse liquid discharged from the rotating substrate W during the removal processing is received by the second guard portion 6*b* (second guard 61*b*). The rinse liquid received by the second guard portion 6*b* is recovered into the fluid cabinet 101 by means of the recovery portion 9.

In this preferred embodiment, the removal processing is performed after the paddle processing. Therefore, the controller 10 (control portion 11) stops the supply of the rinse liquid during the process performed from the paddle processing to the removal processing.

The controller 10 (control portion 11) performs the second chemical liquid processing in accordance with the lapse of a predetermined fourth set time after the removal processing is started (step S5 of FIG. 6). The fourth set time is set so that the time becomes equal to or more than a period of time that is required to remove the rinse liquid from each of the recess portions 320 included in a pattern PT having a high aspect ratio. For example, the fourth set time may be selected from a range of not less than three seconds and not more than five seconds. According to this preferred embodiment, it is possible to remove the rinse liquid from the each of the recess portions 320 included in the pattern PT having the high aspect ratio by means of the removal processing.

The second chemical liquid processing shows processing in which the second chemical liquid (TMAH) is supplied to the substrate W while controlling the processing liquid supply portion 4 (second chemical liquid supply portion 42). As a result, the polysilicon layers 332 included in the laminated structure 330 are etched.

Concretely, the controller 10 (control portion 11) controls the second nozzle moving portion 52, and allows the second nozzle moving portion 52 to move the second discharge nozzle 42*a* from the second retreat position EP2 to the center position CP. In detail, the controller 10 (control portion 11) moves the second discharge nozzle 42*a* from the second retreat position EP2 to the center position CP during the removal processing as shown in FIG. 11A.

The controller 10 (control portion 11) controls the second chemical liquid supply portion 42, and allows the second chemical liquid supply portion 42 to discharge the second chemical liquid from the second discharge nozzle 42*a* in accordance with the lapse of the fourth set time after the removal processing is started as shown in FIG. 12A. As a result, a liquid film LF3 of the second chemical liquid is formed on the upper surface of the substrate W from which the rinse liquid has been removed. In detail, the second chemical liquid enters the inside of each of the recess portions 320 as shown in FIG. 12B. When the second chemical liquid processing is started, the controller 10 (control portion 11) controls the substrate rotating portion 3, and allows the substrate rotating portion 3 to rotate the substrate W at a fourth rotation speed. The fourth rotation speed is, for example, 800 rpm.

The second chemical liquid discharged from the rotating substrate W during the second chemical liquid processing is received by the second guard portion 6*b* (second guard 61*b*). The second chemical liquid received by the second guard portion 6*b* is recovered into the fluid cabinet 101 by means of the recovery portion 9.

According to this preferred embodiment, a state is reached in which the rinse liquid does not remain in the recess portion 320 before starting the second chemical liquid processing as described with reference to FIG. 11B, and therefore it is possible to uniform the recessed amount of the recess 333 in a range from an opening portion to a deepest portion of the recess portion 320.

In detail, if the second chemical liquid is supplied to the substrate W in a state in which the rinse liquid remains in the recess portion 320, there is a concern that the concentration of the second chemical liquid will become low at a deep position in the recess portion 320 because of the rinse liquid. In other words, there is a concern that the concentration of the second chemical liquid in the recess portion 320 will become nonuniform. If the concentration of the second chemical liquid in the recess portion 320 becomes nonuniform, the etching amount of the polysilicon layer 332 becomes nonuniform, and the size of the hollow cavity of the recess 333 becomes nonuniform.

On the other hand, according to this preferred embodiment, a state is reached in which the rinse liquid does not remain in the recess portion 320 before the start of the second chemical liquid processing, and therefore it is possible to substantially uniform the concentration of the second chemical liquid in the range from the opening portion to the deepest portion of the recess portion 320. As a result, it is possible to uniform an etching amount of the polysilicon layer 332 in the range from the opening portion to the deepest portion of the recess portion 320. Therefore, it is possible to uniform the recessed amount of the recess 333 in the range from the opening portion to the deepest portion of the recess portion 320.

Also, when the first guard switching processing is performed after the removal processing, a period of time during which the surface of the substrate W is exposed to an atmosphere becomes long. On the other hand, according to this preferred embodiment, the first guard switching processing is performed before the removal processing, and therefore it is possible to shorten a period of time during which the surface of the substrate W is exposed to the atmosphere after the removal processing. Concretely, it is possible to make a change from a state in which the upper surface of the substrate W is not covered with a liquid film (liquid film LF2 of the rinse liquid) to a state in which the upper surface of the substrate W is covered with a liquid film (liquid film LF3 of the second chemical liquid) in a shorter period of time than in a case in which the first guard switching processing is performed after the removal processing. Therefore, it is possible to suppress the formation of a natural oxide film on the surface of the substrate W.

Also, according to this preferred embodiment, the removal processing is performed after the paddle processing. The liquid film LF2 of the rinse liquid during the paddle processing is thinner than the liquid film LF2 of the rinse liquid formed when a continuous flow of the rinse liquid is discharged from the third discharge nozzle 43*a*. Therefore, it is possible to reduce the amount of the rinse liquid recovered into the fluid cabinet 101 during the removal processing by performing the removal processing after the paddle processing. Therefore, it is possible to suppress a reduction in concentration of the second chemical liquid (TMAH).

Also, according to this preferred embodiment, the supply of the rinse liquid is stopped during the removal processing. Therefore, it is possible to move the second discharge nozzle 42*a* from the second retreat position EP2 to the center position CP during the removal processing as shown in FIG. 11A. Therefore, it is possible to make a change from a state in which the upper surface of the substrate W is not covered with a liquid film (liquid film LF2 of the rinse liquid) to a state in which the upper surface of the substrate W is covered with a liquid film (liquid film LF3 of the second chemical liquid) in a short period of time. In other words, it is possible to shorten a period of time during which the surface of the substrate W is exposed to the atmosphere. Therefore, it is possible to suppress the formation of a natural oxide film on the surface of the substrate W.

Also, according to this preferred embodiment, the first guard switching processing is performed during the paddle processing, and therefore it is possible to make the amount of the rinse liquid recovered into the fluid cabinet 101 smaller than in a case in which the first guard switching processing is performed while supplying the rinse liquid to the substrate W. As a result, it is possible to suppress a reduction in concentration of the second chemical liquid (TMAH).

Also, in this preferred embodiment, the fourth rotation speed is the same as the third rotation speed. In other words, the controller 10 (control portion 11) maintains the rotation speed of the substrate W at the same rotation speed over a period from the removal processing to the start of the second chemical liquid processing.

In detail, the controller 10 (control portion 11) controls the substrate rotating portion 3 during the removal processing, and allows the substrate rotating portion 3 to rotate the substrate W at a rotation speed equal to the rotation speed of the substrate W when the second chemical liquid processing is started. Therefore, when a change is made from the removal processing to the second chemical liquid processing, there is no need to perform processing to change the rotation speed while controlling the substrate rotating portion 3. Therefore, it is possible to make a change from a state in which the upper surface of the substrate W is not covered with a liquid film (liquid film LF2 of the rinse liquid) to a state in which the upper surface of the substrate W is covered with a liquid film (liquid film LF3 of the second chemical liquid) in a shorter period of time than in a case in which the processing to change the rotation speed is performed when a change is made from the removal processing to the second chemical liquid processing. Therefore, it is possible to suppress the formation of a natural oxide film on the surface of the substrate W.

The controller 10 (control portion 11) performs the scan processing in accordance with the lapse of a predetermined fifth set time after the second chemical liquid processing is started. The fifth set time is set so that the time becomes equal to or more than a period of time that is required until the entire part of the upper surface of the substrate W is covered with the second chemical liquid from the discharge start of the second chemical liquid. In other words, the fifth set time is set so that the time becomes equal to or more than a period of time that is required to fill the inside of each of the recess portions 320 with the second chemical liquid from the discharge start of the second chemical liquid. For example, the fifth set time is selected from a range of not less than three seconds and not more than five seconds.

In this preferred embodiment, the controller 10 (control portion 11) controls the second nozzle moving portion 52, and allows the second nozzle moving portion 52 to move the second discharge nozzle 42*a* between the center position CP and the first end portion facing position P1, and the controller 10 (control portion 11) controls the second chemical liquid supply portion 42, and allows the second chemical liquid supply portion 42 to discharge the second chemical liquid (TMAH) from the second discharge nozzle 42*a* as shown in FIG. 13. In other words, the controller 10 (control portion 11) performs half scan processing.

The controller 10 (control portion 11) controls the substrate rotating portion 3 during the scan processing, and allows the substrate rotating portion 3 to reduce the rotation speed of the substrate W when the second discharge nozzle 42*a* is placed at the first end portion facing position P1.

Concretely, the controller 10 (control portion 11) rotates the substrate W at a fifth rotation speed when the second discharge nozzle 42*a* is placed at the center position CP. Also, the controller 10 (control portion 11) rotates the substrate W at the fifth rotation speed while moving the second discharge nozzle 42*a*. The controller 10 (control portion 11) rotates the substrate W at a sixth rotation speed when the second discharge nozzle 42*a* reaches the first end portion facing position P1.

Here, the fifth rotation speed shows a rotation speed lower than the fourth rotation speed (rotation speed of the substrate W when the second chemical liquid processing is started). The fifth rotation speed is, for example, 250 rpm. Also, the sixth rotation speed shows a rotation speed lower than the fifth rotation speed. The sixth rotation speed is, for example, 150 rpm.

According to this preferred embodiment, during the scan processing, the substrate W is rotated at a rotation speed lower than a rotation speed shown when the supply of the second chemical liquid is started. As thus described, a state in which the temperature of the second chemical liquid (TMAH) is not easily reduced is brought about by slowing down the rotation speed of the substrate W.

Also, according to this preferred embodiment, the rotation speed of the substrate W shown when the second discharge nozzle 42*a* is placed at the first end portion facing position P1 is reduced. Therefore, it is possible to reduce the amount of scatter of the second chemical liquid, which has been discharged to the end portion E of the substrate W, to the outside of the substrate W.

Also, according to this preferred embodiment, the fourth rotation speed (rotation speed of the substrate W when the second chemical liquid processing is started) shows a higher rotation speed than the rotation speed during the scan processing. Therefore, it is possible to promptly cover the upper surface of the substrate W with the second chemical liquid when the second chemical liquid processing is started. As a result, it is possible to make a change from a state in which the upper surface of the substrate W is not covered with a liquid film (liquid film LF2 of the rinse liquid) to a state in which the upper surface of the substrate W is covered with a liquid film (liquid film LF3 of the second chemical liquid) in a short period of time after the removal processing is ended. Therefore, it is possible to suppress the formation of a natural oxide film on the surface of the substrate W.

Also, according to this preferred embodiment, when the second chemical liquid processing is started, the upper surface of the substrate W is promptly covered with the second chemical liquid, and therefore the etching amount of the polysilicon layer 332 does not easily become nonuniform between the central portion and the end portion E of the substrate W.

The controller 10 (control portion 11) performs the second rinse processing in accordance with the lapse of a predetermined sixth set time after the scan processing is started (step S6 of FIG. 6). The second rinse processing shows processing in which the processing liquid supply portion 4 (rinse liquid supply portion 43) is controlled, and a rinse liquid (second rinse liquid) is supplied to the substrate W while rotating the substrate W by controlling the substrate rotating portion 3. The second chemical liquid is washed away from the substrate W by the second rinse processing.

Concretely, the controller 10 (control portion 11) controls the second chemical liquid supply portion 42, and allows the second chemical liquid supply portion 42 to stop the supply of the second chemical liquid, and then the second nozzle moving portion 52 is controlled, and the second discharge nozzle 42*a* is moved from the center position CP or from the first end portion facing position P1 to the second retreat position EP2 as shown in FIG. 14. Also, the controller 10 (control portion 11) controls the substrate rotating portion 3, and allows the substrate rotating portion 3 to rotate the substrate W at a seventh rotation speed. Thereafter, the controller 10 (control portion 11) controls the rinse liquid supply portion 43, and allows the rinse liquid supply portion 43 to discharge the rinse liquid from the third discharge nozzle 43*a*.

In this preferred embodiment, the seventh rotation speed is a rotation speed higher than both the fifth rotation speed and the sixth rotation speed. In other words, the controller 10 (control portion 11) controls the substrate rotating portion 3 after the second chemical liquid processing (scan processing) is ended, and allows the substrate rotating portion 3 to increase the rotation speed of the substrate W. The seventh rotation speed is, for example, 800 rpm.

When the rinse liquid is supplied to the upper surface of the rotating substrate W by means of the second rinse processing, the second chemical liquid is washed away from the substrate W, and the liquid film LF2 of the rinse liquid is formed on the upper surface of the substrate W. In detail, the rinse liquid enters the inside of each of the recess portions 320 in the same way as the first rinse processing described with reference to FIG. 8B, and, as a result, the second chemical liquid is discharged from each of the recess portions 320, and the second chemical liquid is washed away from the substrate W.

The second chemical liquid and the rinse liquid that have been discharged from the rotating substrate W during the second rinse processing are received by the second guard portion 6*b* (second guard 61*b*). The second chemical liquid and the rinse liquid received by the second guard portion 6*b* are recovered into the fluid cabinet 101 by means of the recovery portion 9.

In accordance with the lapse of a predetermined time after the second rinse processing is started, the controller 10 (control portion 11) performs second guard switching processing. In this preferred embodiment, the controller 10 (control portion 11) switches the guard portion 6 surrounding the substrate W from the second guard portion 6*b* to the third guard portion 6*c* as shown in FIG. 14 after the second rinse processing is started, and then the second chemical liquid is washed away from the substrate W, and then the liquid film LF2 of the rinse liquid is formed on the upper surface of the substrate W. Concretely, the controller 10 (control portion 11) controls the second elevating/lowering portion 72, and allows the second elevating/lowering portion 72 to move the second guard portion 6*b* to the lower position.

After the second guard switching processing is performed, the rinse liquid discharged from the rotating substrate W is received by the third guard portion 6*c* (third guard 61*c*). The rinse liquid received by the third guard portion 6*c* is discharged into the drain tank 84 by means of the second drainage portion 82.

According to this preferred embodiment, it is possible to make the amount of the rinse liquid recovered into the fluid cabinet 101 smaller than in a case in which the second guard switching processing is not performed. As a result, it is possible to suppress a reduction in concentration of the second chemical liquid (TMAH).

After performing the second guard switching processing, the controller 10 (control portion 11) controls the substrate rotating portion 3, and allows the substrate rotating portion 3 to increase the rotation speed of the substrate W from the seventh rotation speed to an eighth rotation speed. For example, the controller 10 (control portion 11) gradually increases the rotation speed of the substrate W from 800 rpm to 1200 rpm.

In this preferred embodiment, the rinse liquid (second rinse liquid) used in the second rinsing step (second rinse processing) is the same as the rinse liquid (first rinse liquid) used in the first rinsing step (first rinse processing). However, the rinse liquid (second rinse liquid) used in the second rinsing step (second rinse processing) may be a rinse liquid differing from the rinse liquid (first rinse liquid) used in the first rinsing step (first rinse processing).

The controller 10 (control portion 11) performs the drying processing in accordance with the lapse of a predetermined seventh set time after the second rinse processing is started (step S7 of FIG. 6). The drying processing includes processing in which the rotation speed of the substrate W is increased to a ninth rotation speed, and the substrate W is dried while controlling the substrate rotating portion 3. The ninth rotation speed is, for example, 2500 rpm.

Concretely, the controller 10 (control portion 11) controls the rinse liquid supply portion 43, and allows the rinse liquid supply portion 43 to stop the supply of the rinse liquid, and then the controller 10 (control portion 11) controls the substrate rotating portion 3, and allows the substrate rotating portion 3 to increase the rotation speed of the substrate W to the ninth rotation speed as shown in FIG. 15. As a result, a large centrifugal force is given to the rinse liquid on the substrate W, and the rinse liquid adhering to the substrate W scatters to the surroundings of the substrate W. In this way, the rinse liquid is removed from the substrate W, and the substrate W is dried. The rinse liquid that has scattered from the substrate W is received by the third guard portion 6*c* (third guard 61*c*). The rinse liquid received by the third guard portion 6*c* is discharged into the drain tank 84 by means of the second drainage portion 82.

In accordance with the lapse of a predetermined eighth set time after the drying processing is started, the controller 10 (control portion 11) controls the substrate rotating portion 3, and allows the substrate rotating portion 3 to stop of the rotation of the substrate W. As a result, the drying processing is ended. The eighth set time may be selected from a range of not less than 20 seconds and not more than 30 seconds.

After the drying processing is ended, the controller 10 (control portion 11) performs the substrate carry-out processing (step S8 of FIG. 6), and the process shown in FIG. 6 is ended. Concretely, the controller 10 (control portion 11) controls the third elevating/lowering portion 73, and allows the third elevating/lowering portion 73 to move the third guard portion 6*c* to the lower position. Also, the controller 10 (control portion 11) controls the substrate holding portion 2, and allows the substrate holding portion 2 to stop holding the substrate W. Thereafter, the controller 10 (control portion 11) controls the center robot CR, and allows the center robot CR to carry out the substrate W to the outside of the processing room 201.

According to this preferred embodiment, the controller 10 (control portion 11) controls the substrate rotating portion 3, and allows the substrate rotating portion 3 to rotate the substrate W at a lower rotation speed (third rotation speed) during the removal processing than the rotation speed (ninth rotation speed) of the substrate W during the drying processing. Therefore, the substrate W is not dried by the removal processing.

Also, according to this preferred embodiment, the substrate W is rotated at a rotation speed closer to the rotation speed (fourth rotation speed) of the substrate W when the second chemical liquid processing is started during the removal processing than the rotation speed (ninth rotation speed) of the substrate W during the drying processing. Therefore, it is possible to promptly adjust the rotation speed of the substrate W after the removal processing so as to become a rotation speed (fourth rotation speed) when the second chemical liquid processing is started. Therefore, it is possible to start the second chemical liquid processing in a short time after the removal processing.

Also, according to this preferred embodiment, the execution time (fourth set time) of the removal processing is shorter than the execution time (eighth set time) of the drying processing. Therefore, the length of time of the removal step (step S4 of FIG. 6) is shorter than the length of time of the drying step (step S7 of FIG. 6). In other words, the controller 10 (control portion 11) performs the removal processing in a shorter period of time than the drying processing. Therefore, the substrate W is not dried by the removal processing. Also, it is possible to start the second chemical liquid processing in a short time after the first rinse processing (paddle processing) is ended.

The preferred embodiment of the present disclosure has been described with reference to FIG. 1 to FIG. 15 as above. According to this preferred embodiment, it is possible to remove the rinse liquid that has entered the recess portion 320 from the substrate W without supplying IPA steam or nitrogen gas. Therefore, it is possible to remove the rinse liquid that has entered the recess portion 320 from the substrate W by means of a simpler configuration.

Also, according to this preferred embodiment, it is possible to remove the rinse liquid from the recess portion 320 by means of the removal processing even if the pattern PT has a high aspect ratio. Therefore, it is possible to allow the second chemical liquid to enter the inside of the recess portion 320 in which the rinse liquid does not remain even if the pattern PT has a high aspect ratio. In other words, it is possible to replace the rinse liquid with the second chemical liquid in the range from the opening portion to the deepest portion of the recess portion 320 included in the pattern PT having a high aspect ratio. Therefore, it is possible to substantially uniform the recessed amount of the recess 333 in the range from the opening portion to the deepest portion of the recess portion 320 even if the pattern PT has a high aspect ratio.

Also, there is a case in which the amount of polysilicon at the end portion E of the substrate W becomes larger than that at the central portion of the substrate W, which depends on preprocessing with respect to the substrate W that is a target to be processed by the substrate processing apparatus 100. In this case, if the central portion and the end portion E of the substrate W are substantially equal to each other in the etching amount of the polysilicon layer 332, there is a possibility that the size in the plane direction D3 of the polysilicon layer 332 that has been subjected to etching will not become uniform between the central portion and the end portion E of the substrate W.

On the other hand, according to this preferred embodiment, the rotation speed of the substrate W is reduced when the second discharge nozzle 42*a* is placed at the first end portion facing position P1 during the scan processing. Therefore, it is possible to make the amount of the second chemical liquid (TMAH) discharged from the substrate W when the second discharge nozzle 42*a* is placed at the first end portion facing position P1 smaller than in a case in which the rotation speed of the substrate W is not reduced when the second discharge nozzle 42*a* is placed at the first end portion facing position P1. Therefore, it is possible to make the etching amount at the end portion E of the substrate W larger than at the central portion of the substrate W. As a result, even if the amount of polysilicon at the end portion E of the substrate W is larger than that at the central portion of the substrate W, it is possible to substantially uniform the size in the plane direction D3 of the polysilicon layer 332 that has been subjected to etching between the central portion and the end portion E of the substrate W.

Also, according to this preferred embodiment, it is possible to adjust the etching amount at the end portion E of the substrate W by adjusting the second stopping time. For example, it is possible to further increase the etching amount at the end portion E of the substrate W by increasing the second stopping time.

The present disclosure is not limited to the aforementioned preferred embodiment, and can be embodied in various modes in a range not departing from its gist. Also, a plurality of the components disclosed by the aforementioned preferred embodiment can be appropriately modified. For example, a component among all components shown in a preferred embodiment may be added to components of another preferred embodiment, or some components among all components shown in a preferred embodiment may be deleted from the preferred embodiment.

The drawings are schematically shown to facilitate an understanding while being depicted on the basis of each component, and, in some cases, the thickness, the length, the number, the distance, etc., of each component shown therein are different from actual ones for the convenience of the creation of the drawings. Also, the configuration of each component shown in the aforementioned preferred embodiment is an example without being limited to specific one, and, of course, various modifications can be made in a range not substantially departing from effects of the present disclosure.

For example, in the preferred embodiment described with reference to FIG. 1 to FIG. 15, the first chemical liquid is DHF, and the second chemical liquid is TMAH, and yet specific limitations are not imposed thereon as long as the first chemical liquid and the second chemical liquid are chemical liquids with which mutually-different guard portions 6 are used.

Also, in the preferred embodiment described with reference to FIG. 1 to FIG. 15, the substrate processing is etching, and yet the substrate processing is not particularly limited as long as the processing is applied to a substrate (substrate W) having the pattern PT including the recess portion 320.

Also, in the preferred embodiment described with reference to FIG. 1 to FIG. 15, the rotation of the substrate W is stopped during the paddle processing, and yet the substrate W may be rotated at a rotation speed at which the rinse liquid is not discharged from the substrate W during the paddle processing. For example, the substrate W may be rotated at a rotation speed of 10 rpm during the paddle processing.

Also, in the preferred embodiment described with reference to FIG. 1 to FIG. 15, the paddle processing is performed before the removal processing, and yet the paddle processing may be omitted. In this case, the guard portion 6 surrounding the substrate W is switched from the first guard portion **6*a* to the second guard portion 6*b* when the rinse liquid is supplied from the third discharge nozzle 43*a*** to the substrate W.

Also, in the preferred embodiment described with reference to FIG. 1 to FIG. 15, the substrate processing apparatus 100 is provided with the single drain tank 84, and yet the substrate processing apparatus 100 may be provided with two drain tanks 84. In this case, the first drainage portion 81 may discharge the processing liquid gathered in the first cup **62*a* to one of the drain tanks 84, and the second drainage portion 82 may discharge the processing liquid gathered in the third cup 62*c* to the other drain tank 84. The substrate processing apparatus 100 may be provided with three or more drain tanks 84**.

Also, in the preferred embodiment described with reference to FIG. 1 to FIG. 15, part of the processing liquid discharged from the substrate W is allowed to flow into the drain tank 84, and yet the drainage portion 8 may allow part of the processing liquid discharged from the substrate W to flow into a waste liquid line of a factory in which the substrate processing apparatus 100 is installed.

Also, in the preferred embodiment described with reference to FIG. 1 to FIG. 15, only deionized water is used as the rinse liquid (first rinse liquid and second rinse liquid), and yet mutually-different rinse liquids may be used in the first rinsing step (step S3 of FIG. 6) and the second rinsing step (step S7 of FIG. 6), respectively.

Also, in the preferred embodiment described with reference to FIG. 1 to FIG. 15, the substrate processing apparatus 100 including three guard portions 6 (first to third guard portions **6*a* to 6*c*) is shown as an example, and yet the substrate processing apparatus 100 may include two guard portions 6 or four or more guard portions 6. In other words, it suffices that the substrate processing apparatus 100 includes at least two guard portions 6**.

Also, in the preferred embodiment described with reference to FIG. 1 to FIG. 15, the gripping-type chuck that tightly holds the substrate W has been described as a configuration for holding the substrate W, and yet specific limitations are not imposed on the configuration for holding the substrate W as long as the substrate W can be horizontally held. For example, a vacuum-type chuck may be employed as the configuration for holding the substrate W.

What is claimed is:

1. A substrate processing method of processing a substrate having a pattern including a recess portion, the substrate processing method comprising:

supplying a first chemical liquid to the substrate;

supplying a first rinse liquid to the substrate while said substrate is being rotated;

holding a liquid film of the first rinse liquid on the substrate in a state in which supply of the first rinse liquid is stopped and rotation of the substrate has also been stopped;

after holding the liquid film on the substrate for a given time duration, restarting rotating the substrate in a state in which supply of the first rinse liquid is stopped, and discharging the first rinse liquid from the recess portion, and removing the first rinse liquid from the substrate; and supplying a second chemical liquid to the substrate from which the first rinse liquid has been removed, wherein in supplying the first chemical liquid to the substrate, the first chemical liquid is supplied to the substrate while the substrate is rotating, and the first chemical liquid discharged from the substrate is received by a first guard surrounding the substrate, while holding the liquid film of the first rinse liquid on the substrate during said holding step, switching a guard surrounding the substrate from the first guard to a second guard, in removing the first rinse liquid from the substrate, the first rinse liquid discharged from the substrate that is rotating is received by the second guard, and in supplying the second chemical liquid to the substrate, the second chemical liquid is supplied to the substrate while the substrate is rotating, and the second chemical liquid discharged from the substrate that is rotating is received by the second guard.

2. The substrate processing method according to claim 1, wherein, in removing the first rinse liquid from the substrate and in supplying the second chemical liquid to the substrate, the first rinse liquid and the second chemical liquid received by the second guard are recovered.

3. The substrate processing method according to claim 1, wherein, in removing the first rinse liquid from the substrate, the substrate is rotated at a rotation speed equal to a rotation speed of the substrate when the supplying of the second chemical liquid to the substrate is started.

4. The substrate processing method according to claim 1, further comprising: supplying a second rinse liquid to the substrate that is rotating and washing away the second chemical liquid from the substrate; and thereafter increasing a rotation speed of the substrate to a drying rotation speed and drying the substrate, wherein in removing the first rinse liquid from the substrate, the substrate is rotated at a lower rotation speed than the drying rotation speed.

5. The substrate processing method according to claim 1, further comprising: supplying a second rinse liquid to the substrate that is rotating and washing away the second chemical liquid from the substrate; and thereafter increasing a rotation speed of the substrate to a drying rotation speed and drying the substrate, wherein a length of time of removing the first rinse liquid from the substrate is shorter than a length of time of drying the substrate.

6. The substrate processing method according to claim 1, wherein the pattern includes a multi-layer laminated structure in which a polysilicon layer and a silicon oxide layer are alternately laminated.

7. The substrate processing method according to claim 6, wherein the multi-layer laminated structure includes a laminated structure having eighty or more layers.

8. The substrate processing method according to claim 6, wherein the recess portion is hollowed in a lamination direction that is a direction in which the polysilicon layer and the silicon oxide layer are alternately laminated, and supplying the second chemical liquid to the substrate includes etching the polysilicon layer and forming a dent on an inner surface of the recess portion.

9. The substrate processing method according to claim 1, wherein the first chemical liquid includes an acidic chemical liquid, and the second chemical liquid includes an alkaline chemical liquid.

10. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 1.

11. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 2.

12. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 3.

13. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 4.

14. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 5.

15. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 6.

16. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 7.

17. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 8.

18. A substrate processing apparatus that processes a substrate having a pattern including a recess portion, the substrate processing apparatus comprising:

a substrate holder that horizontally holds the substrate;

a substrate rotator that rotates the substrate holder about a central axis extending in an up-down direction and that rotates the substrate together with the substrate holder;

a processing liquid supply that supplies a processing liquid to the substrate, wherein the processing liquid includes a first chemical liquid, a first rinse liquid, and a second chemical liquid;

a plurality of guards that surround the substrate and that receive the processing liquid discharged from the substrate, wherein the plurality of guards include a first guard and a second guard;

an elevator that individually elevates and lowers the plurality of guards and that switches a guard surrounding the substrate among the plurality of guards; and a controller that controls the substrate rotator, the processing liquid supply, and the elevator, wherein the controller is configured or programmed to execute the substrate processing method according to claim 9.

* * * * *